(12) United States Patent
Hansen et al.

(10) Patent No.: US 8,013,999 B2
(45) Date of Patent: Sep. 6, 2011

(54) BEAM CHARACTERIZATION MONITOR FOR SENSING POINTING OR ANGLE OF AN OPTICAL BEAM

(75) Inventors: Matthew E. Hansen, Milford, CT (US); Ronald A. Wilklow, Fairfield, CT (US)

(73) Assignee: ASML Holding N.V., Veldhoven (NL)

( * ) Notice: Subject to any disclaimer, the term of this patent is extended or adjusted under 35 U.S.C. 154(b) by 209 days.

(21) Appl. No.: 12/339,217

(22) Filed: Dec. 19, 2008

(65) Prior Publication Data

US 2009/0161088 A1    Jun. 25, 2009

Related U.S. Application Data

(60) Provisional application No. 61/015,897, filed on Dec. 21, 2007, provisional application No. 61/084,838, filed on Jul. 30, 2008.

(51) Int. Cl.
*G01N 21/55* (2006.01)

(52) U.S. Cl. ............................................. 356/445

(58) Field of Classification Search .......... 356/445–448, 356/237.1–237.5
See application file for complete search history.

(56) References Cited

U.S. PATENT DOCUMENTS 7,173,270 B1 * 2/2007 Bruinsma et al. ........ 250/559.41
7,233,396 B1 * 6/2007 Hall et al. .................... 356/369

* cited by examiner

*Primary Examiner* — Michael P Stafira
(74) *Attorney, Agent, or Firm* — Sterne, Kessler, Goldstein & Fox P.L.L.C

(57) ABSTRACT

The divergence of an optical beam is determined. An optic is configured to provide internal reflection of at least a part of a beam of radiation scanned over varying angles of incidence on the optic. The optic has a film configured to provide a surface plasmon resonance (SPR) effect. A detector is arranged relative to the optic and configured to electronically detect radiation reflected from the optic. The divergence angle of the beam of radiation is calculated based on a change in reflectance relative to angle of incidence.

25 Claims, 37 Drawing Sheets

INTERNAL REFLECTION/
TRANSMISSION

TOTAL INTERNAL
REFLECTION

COATING-ASSISTED TIR

US 8,013,999 B2

BEAM CHARACTERIZATION MONITOR FOR SENSING POINTING OR ANGLE OF AN OPTICAL BEAM

CROSS-REFERENCE TO RELATED APPLICATION

This application claims priority to U.S. application Ser. No. 61/015,897 filed on Dec. 21, 2007 and to U.S. application Ser. No. 61/084,838 filed on Jul. 30, 2008. The subject matter of both of those prior applications is incorporated herein by reference as if fully set forth.

BACKGROUND

1. Field of the Invention

The present invention relates to a monitor for sensing pointing, angle, and/or divergence of an optical beam, suitable for use as part of a lithographic apparatus.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which can be referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (resist) provided on the substrate.

Although a patterning device is often used to create a circuit pattern, it can also be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

Photolithography (also called microlithography) is used for manufacturing of semiconductor devices. Photolithography uses electromagnetic radiation, such as ultraviolet (UV), deep UV or visible light to generate fine patterns in a semiconductor device design. Many types of semiconductor devices, such as diodes, transistors, and integrated circuits, can be fabricated using photolithographic techniques. Exposure systems or tools are used to implement photolithographic techniques, such as etching, in semiconductor fabrication. An exposure system typically includes an illumination system, a reticle (also called a mask) containing a pattern, such as, for example, a circuit pattern, a projection system, and a wafer alignment stage for aligning a photosensitive resist-covered semiconductor wafer. The illumination system illuminates a region of the reticle with a preferably rectangular slot illumination field. The projection system projects an image of the illuminated region of the reticle circuit pattern onto the wafer.

Instead of a mask, in some lithographic apparatus, the patterning device can be a patterning array that comprises an array of individually controllable elements. Sometimes, the pattern can be changed more efficiently in a maskless system compared to a mask-based system. These types of apparatus are referred to as Optical Maskless Lithographic (OML) apparatus.

Known lithographic apparatus include so-called steppers or step-and-repeat apparatus, and so-called scanners or step-and-scan apparatus. In a stepper each target portion is irradiated by exposing an entire pattern onto the target portion at one time, and the wafer is moved by a predetermined amount to a next position for a subsequent exposure. In a scanner, each target portion is irradiated by scanning the pattern through a radiation beam in a given direction (the "scanning"-direction) while synchronously scanning the substrate parallel or anti-parallel to this direction, and next the wafer is moved to a next position for a subsequent exposure.

Some illumination systems include an array or diffractive scattering optical element positioned before, or optically ahead of, the reticle. The scattering optical element produces a desired angular light distribution that is subsequently imaged or relayed to the reticle.

Some illumination systems include a beam pointing sensor. Many beam pointing sensors typically measure the positional shift of a beam after traversing a transform lens. The transform lens serves to change beam pointing (position) variation into lateral beam shift (angle). The shift is then detected on an electronic position sensing device (PSD).

Some illumination systems include a beam divergence sensor. Many beam divergence sensors typically measure a change in beam size or footprint due to propagation of the beam over a known distance. However, most beam divergence sensor arrangements have limited sensitivity due to poor definition of illumination drop-off at an edge of the beam footprint. Additionally, ambiguity in measuring beam propagation distance reduces accuracy of the beam divergence determination.

Some illumination systems include a beam divergence sensor. Many beam divergence sensors typically measure a change in beam size or footprint due to propagation of the beam over a known distance. However, most beam divergence sensor arrangements have limited sensitivity due to poor definition of illumination drop-off at an edge of the beam footprint. Additionally, ambiguity in measuring beam propagation distance reduces accuracy of the beam divergence determination.

However, most sensor designs fail to determine beam pointing variation with a precision that is desired. For example, the sensitivity of known detector technology limits the detectable beam pointing variation to tenths of milliradians of angular change. What is needed is an optical apparatus for monitoring and/or sensing a beam pointing, positioning variation, and/or divergence of a beam of light.

SUMMARY

The claimed inventions are illustrated and explained at least in part by various "embodiments" of the invention in the "detailed description" portion of this patent document. This "embodiments" are not intended to limit the invention but rather to collectively help the reader understand the full breadth of the invention.

In one embodiment, there is provided a method for sensing pointing or angle of an optical beam. The method comprises providing within an optical train a transmissive optical element having a surface to detect at least one of a beam angle or a pointing direction of the optical beam, such that the transmissive optical element is configured to support total internal reflection (TIR) for measuring the at least one of a beam angle or a pointing direction of the optical beam.

According to another embodiment there is provided a sensor for measuring optical beam pointing of an optical beam. The sensor comprising a prism having a surface disposed within an optical train. The prism comprises a transmissive material that enables total internal reflection (TIR) for the optical beam. The sensor further comprises a detector to electronically detect a variation in at least one of a beam pointing or a beam position of the optical beam.

According to a further embodiment, there is provided an apparatus for optical monitoring of a beam of light in a lithographic imaging system. The apparatus comprises a sensor for measuring a variation in at least one of a beam pointing or a beam position of the beam of light. The sensor includes an optics configured to provide total internal reflection (TIR) that enables a relatively high angular sensitivity in measuring the variation in the at least one of a beam pointing or a beam position of the beam of light, and a first detector arranged relative to the optics to electronically detect the variation of the beam of light.

According to a yet another embodiment, there is provided a method of optically monitoring a beam of light in a lithographic imaging system. The method comprises configuring an optics to provide total internal reflection (TIR) that enables a relatively high angular sensitivity for measuring a variation in at least one of a beam pointing or a beam position of the beam of light and electronically detecting the variation in the beam of light.

According to a yet another embodiment, there is provided a lithographic apparatus. The lithographic apparatus comprises an illumination system that conditions a beam of light and comprises a sensor for measuring a variation in at least one of a beam pointing or a beam position of the beam of light. The sensor includes an optics configured to provide total internal reflection (TIR) that enables a relatively high angular sensitivity in detecting the variation in the at least one of a beam pointing or a beam position of the beam of light. The sensor further includes a first detector arranged relative to the optics to electronically detect the variation in the beam of light. The sensor further includes an array of individually controllable elements that modulate the beam of light and a projection system that projects the modulated beam of the light onto a target portion of a photosensitive substrate.

In an embodiment of the invention, there is provided a system for sensing divergence of an optical beam. The system has an optic configured to provide internal reflection of at least a part of a beam of radiation. The optic has a disposed film configured to cause a surface plasmon resonance effect. A detector is arranged relative to the optic and configured to electronically detect a divergence angle of a beam of radiation. The detector can be configured to electronically detect the divergence angle of the beam of radiation based on a change in a ratio of reflectance to angle of incidence. The system can have an array of individually controllable elements configured to modulate the beam of radiation and a projection system configured to project the modulated beam of radiation onto a target portion of a photosensitive substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 1A-1D schematically illustrates examples of optics or transmissive optical element such as prisms for optical beam pointing and/or angle measurement and/or beam divergence of an optical beam in accordance with one embodiment of the present invention;

FIG. 1E schematically illustrates a beam pointing sensor and/or beam divergence sensor comprising an electronic optical detector and an optical prism with a surface plasmon resonance (SPR) stack according to one embodiment of the present invention;

FIG. 1F schematically illustrates a beam pointing sensor and/or beam divergence sensor comprising the electronic optical detector and the optical prism with the SPR stack having a stepped thickness stack shape for a SPR dielectric layer according to another embodiment of the present invention;

FIG. 1G schematically illustrates a beam pointing sensor and/or beam divergence sensor comprising the electronic optical detector and the optical prism with the SPR stack having a wedged SPR dielectric layer according to an alternate embodiment of the present invention;

FIG. 2 schematically illustrates the TIR plot of percent reflection as a function of incident angle for a given wavelength of incident optical radiation according to one embodiment of the present invention;

FIG. 3 schematically illustrates an uncoated plot and the TIR with an enhancing optical coating plot of percent reflection as a function of incident angle for a given wavelength of incident optical radiation according to one embodiment of the present invention;

FIG. 4 schematically illustrates a TIR-SPR plot of percent reflection as a function of incident angle for a given wavelength of incident optical radiation according to one embodiment of the present invention;

FIG. 5 schematically represents a single SPR resonance notch and its associated phase shift upon reflection according to one embodiment of the present invention;

FIG. 6 schematically illustrates the relationship between the SPR dielectric film thickness, the nominal position of the absorption notch angle, and the angular width of the SPR absorption notch according to one embodiment of the present invention;

FIG. 7 schematically illustrates the tuning of the SPR absorption layer thickness to optimize the SPR absorption notch depth according to one embodiment of the present invention;

FIG. 8 schematically illustrates limiting the range of the incident illumination to one SPR absorption notch according to one embodiment of the present invention;

FIG. 9A schematically shows a plot of S and P polarization resonance notches for a reflected intensity percent (%) as a function of beam pointing according to one embodiment of the present invention;

FIG. 9B schematically shows a plot of S and P reflected phase for a reflected phase as a function of beam pointing according to one embodiment of the present invention;

FIG. 10A schematically shows a plot of SPR % reflected intensity as a function of beam pointing angle for S and P illumination polarization orientations according to one embodiment of the present invention;

FIG. 10B schematically shows a plot of SPR reflected optical phase as a function of beam pointing angle for S and P illumination polarization orientations according to one embodiment of the present invention.

FIG. 11 schematically illustrates an optical embodiment further providing a cascade of optical stacks to enhance the separation of narrow optical illumination angles according to one embodiment of the present invention;

FIG. 12 schematically illustrates a Wedged version of FIG. 11 according to one embodiment of the present invention;

FIG. 13 schematically illustrates the separating of narrow illumination angles via manipulation of the intensity distribution of the illumination pupil of the optical system to be measured according to one embodiment of the present invention;

FIG. 14 schematically illustrates a combined X and Y prism according to one embodiment of the present invention;

FIG. 15A schematically shows a block diagram of a method of using an apparatus for optical beam pointing measurement in the manner according to one embodiment of the present invention;

FIG. 15B schematically shows a litho tool flow according to one embodiment of the present invention;

FIG. 16 schematically shows a block diagram of the method of FIG. 15A with additional optional steps according to one embodiment of the present invention;

FIG. 17 schematically shows a block diagram including polarization and a cascaded SPR sensor according to one embodiment of the present invention;

FIG. 18 schematically shows beam pointing sensor and/or beam divergence sensor wherein the electronic detector is a photodiode array, thus detecting various spatially-distributed sensor responses across the prism surface according to one embodiment of the present invention;

FIG. 19A schematically illustrates an interferometric embodiment of a first sensor according to one embodiment of the present invention;

FIG. 19B schematically illustrates a polarization orientation discriminating embodiment of a second sensor according to one embodiment of the present invention;

FIG. 20 schematically illustrates an electro-optically addressable embodiment of the SPR sensor according to one embodiment of the present invention;

FIG. 21 schematically illustrates a segmented electro-optically addressable embodiment of the SPR sensor according to one embodiment of the present invention;

FIG. 22 schematically illustrates a slab waveguide embodiment of the SPR sensor according to one embodiment of the present invention;

FIG. 23 schematically illustrates a cylindrically-shaped embodiment of the SPR sensor according to one embodiment of the present invention; and FIGS. 24 and 25 schematically depict maskless lithographic apparatus or system, according to various embodiments of the present invention.

Figure 28:
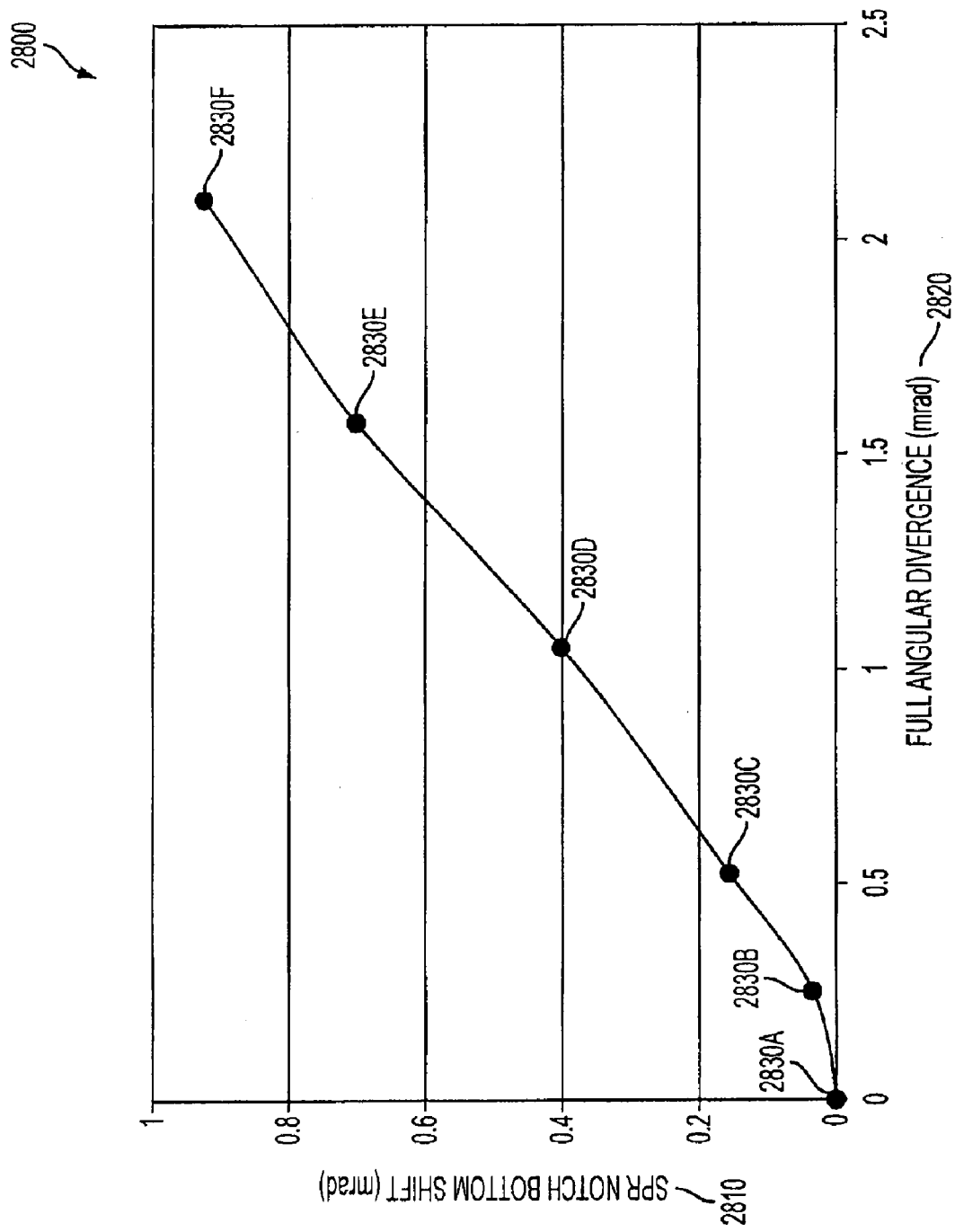

FIG. 28 a graph of minimum reflectance shifting as a function of changes in a divergence angle according to an embodiment of the invention.

Figure 29:
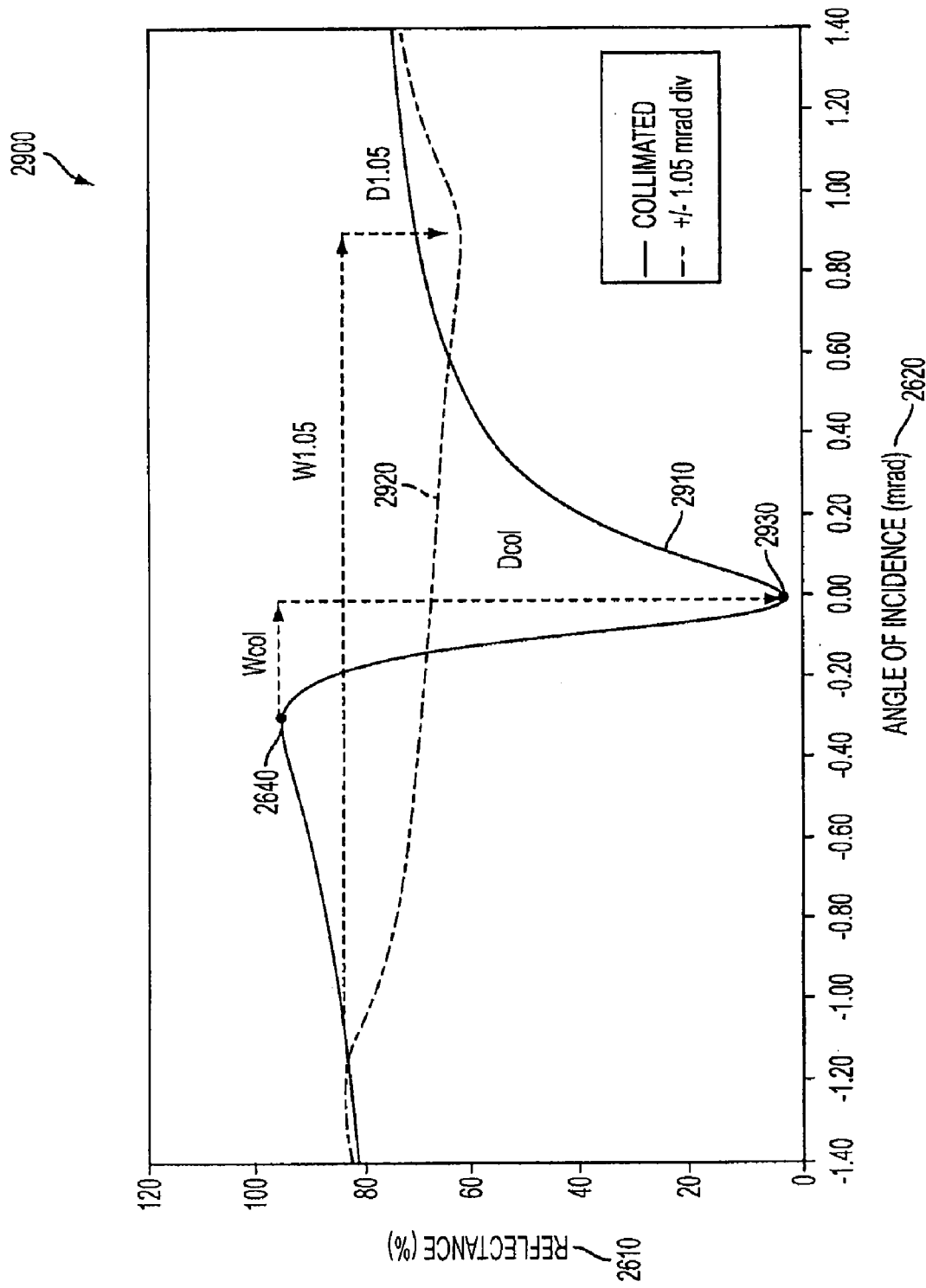

FIG. 29 is a plot of reflectance versus angle of incidence according to an embodiment of the invention.

Figure 30:
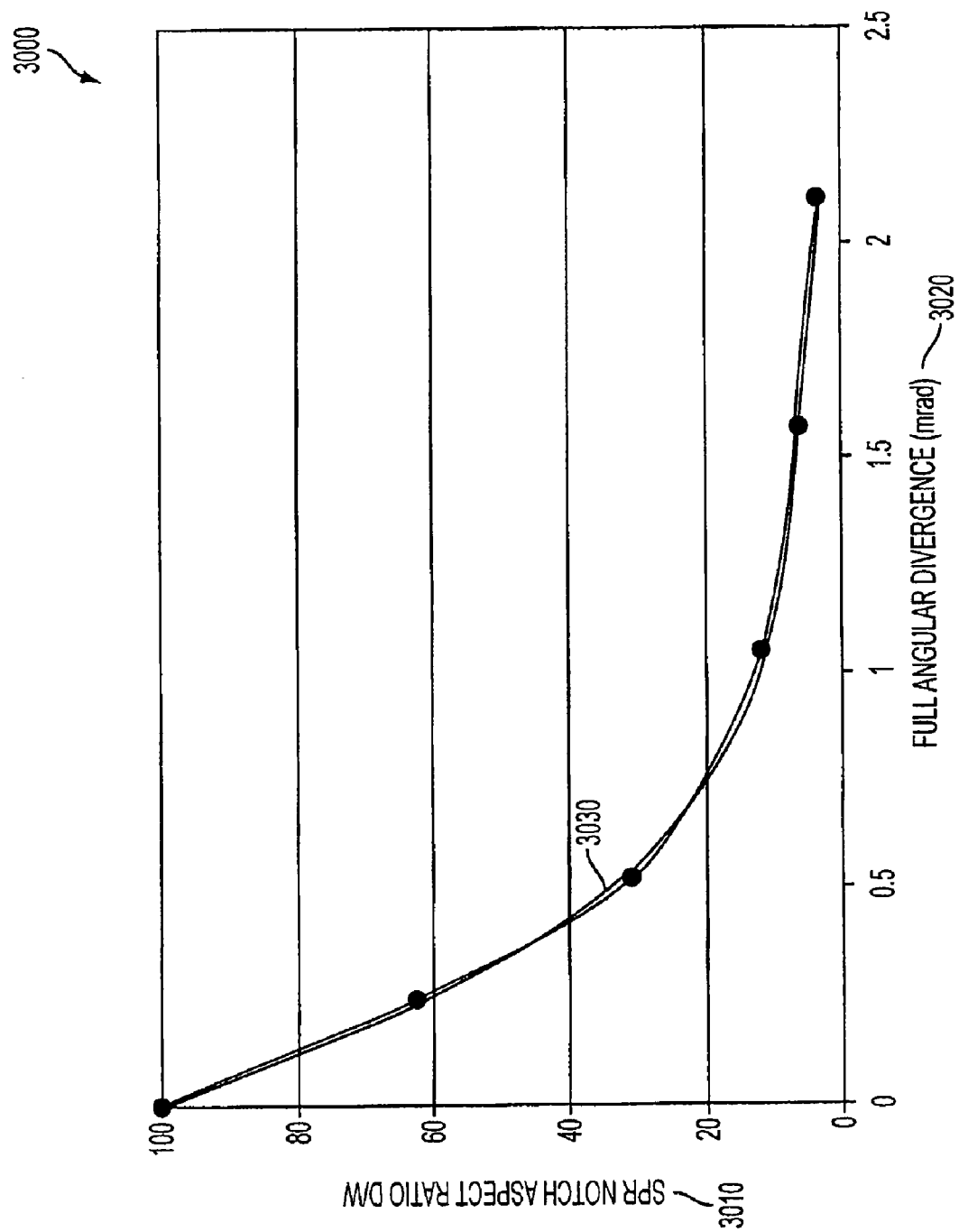

FIG. 30 is a graph of changes in a normalized notch aspect ratio as a function of a divergence angle according to an embodiment of the invention.

Figure 31:
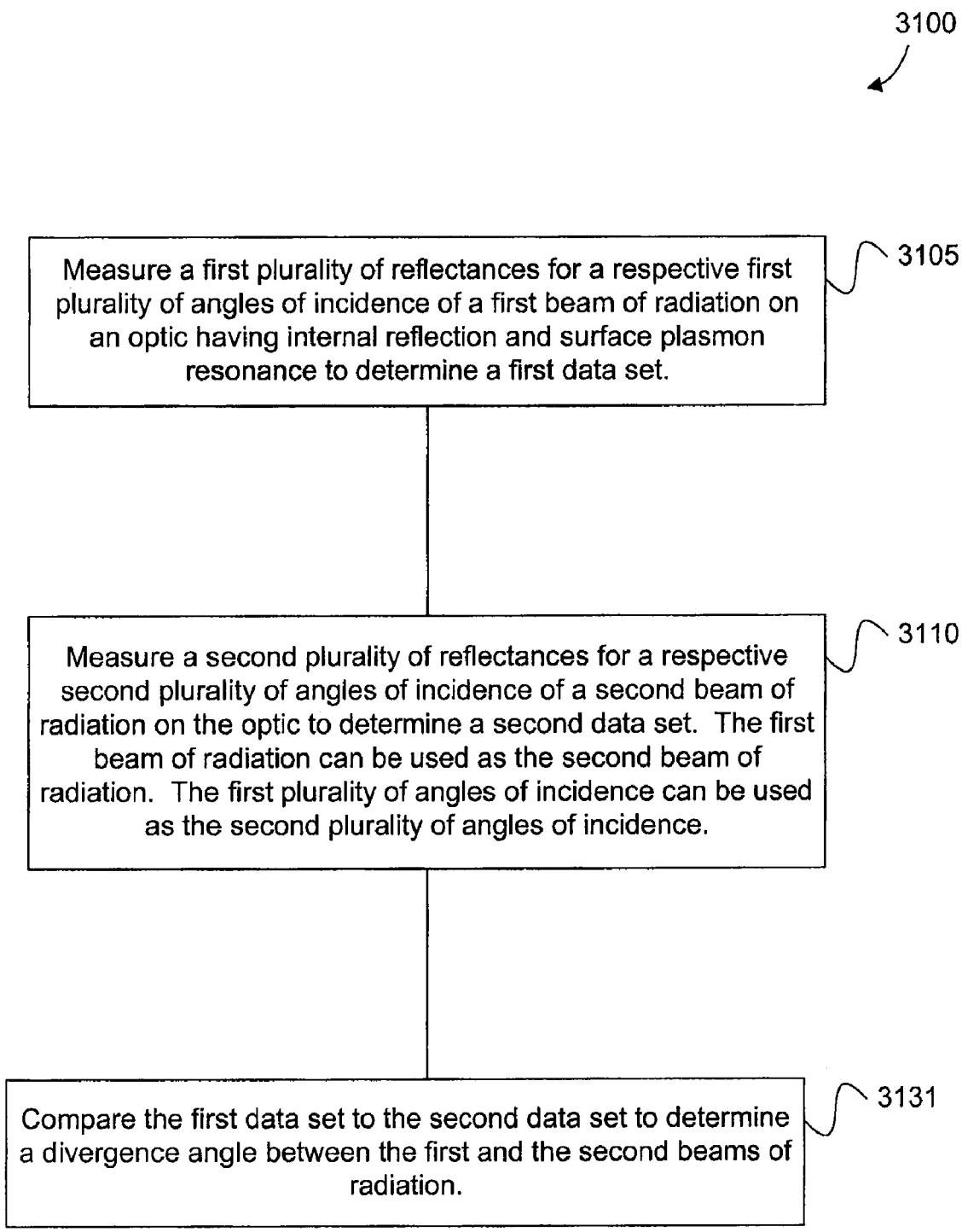

FIG. 31 is a flow chart of a method of using an apparatus for optical beam divergence measurement according to an embodiment of the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

This patent document includes description of one or more "embodiments" that illustrate various features of the claimed inventions including control of fluctuations in one or more of a beam pointing error, a beam positioning error, a beam size error, a beam divergence error, or involving determining divergence of a beam of light. These embodiments exemplify the claimed inventions. The scope of the invention is not limited to the disclosed embodiments. The invention is defined by the claims.

The embodiments described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented at least in part in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

Embodiments of the present invention provide a Total Internal Reflection (TIR) based beam pointing sensor and/or beam divergence sensor that uses the high angular sensitivity of total internal reflection to determine beam pointing variation and/or beam divergence with greater precision than previous sensor designs. The sensitivity of the method can be further enhanced with the addition of an optical coating designed with a rapid transmission cut-off as a function of incidence angle. Surface Plasmon Resonance (SPR) has been conventionally used to monitor film thickness and film refractive index changes, but has not been used as an ultra-sensitive method for measuring beam pointing/position changes. A Surface Plasmon Resonance (SPR)—Total Internal Reflection (TIR) based beam pointing sensor and/or beam divergence sensor uses the high angular sensitivity of total internal reflection and surface plasmon resonance to determine beam pointing variation and/or beam divergence relative to an interferometric alignment of an incident illumination with greater precision than previous sensor designs. The sensitivity of the method can be further enhanced with the addition of polarization phase transition as a function of incidence angle.

Figure 1A:
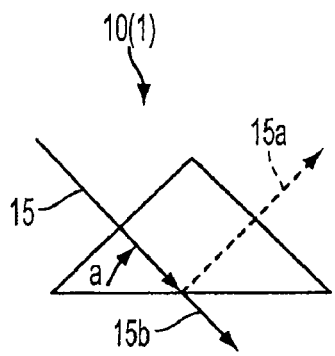
Figure 1B:
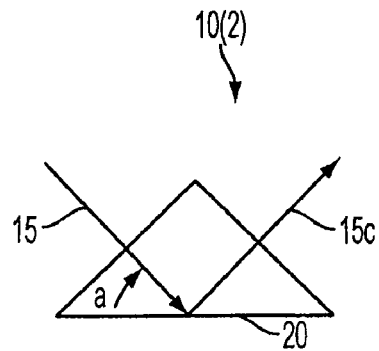
Figure 1C:
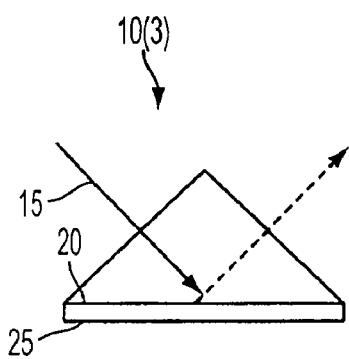
Figure 1D:
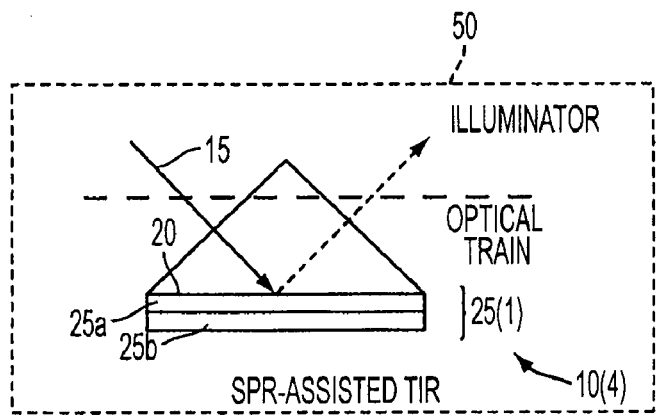

FIGS. 1A-1D schematically illustrate examples of optics or transmissive optical element such as prisms 10(1-4) for optical beam pointing and/or angle and/or beam divergence measurement of an optical beam 15 in accordance with one embodiment of the present invention. In particular, FIG. 1A shows the optical effect of reflection and transmission within a prism 10 of optically transmitting material. FIG. 1B shows the optical effect of TIR within a prism 10 of optically transmitting material. FIG. 1C shows the optical effect of TIR enhanced by optical coatings. FIG. 1D shows the optical effect of SPR in conjunction with the optical effect of TIR.

The prisms 10(1-4) may comprise optically transmissive material such as glass for sensing pointing or angle and/or beam divergence of the optical beam 15. To detect a beam angle "a" or a pointing direction or an angle of incidence of the optical beam 15, the prism 10(1) may support at least one physical or optical property. As shown, the beam at the beam angle "a" in FIG. 1A may exhibit internal reflection, as shown by an arrow 15a, and a refraction, as shown by an arrow 15b. However, as shown in FIG. 1B, the prism 10(2) for the optical beam 15 at a beam angle "a" may support total internal reflection (TIR), as shown by an arrow 15c. In a further example, the optics described herein, such as prism 10(2), provide a maximum reflectance that is less than a theoretical TIR. The prism 10(2) with the TIR may be used for measuring the beam angle "a" or the pointing direction or the angle of incidence of the optical beam 15.

To increase a given angular sensitivity made available due to TIR, a portion of a surface 20 of the prism 10(3) may be coated with a coating layer 25 as shown in FIG. 1C. The coating layer 25 may comprise a material that enables measuring of a variation in a beam angle between the two beam angles a, a' i.e., a corresponding pointing direction or angle of incidence of the optical beam 15 relative to an interferometric alignment of an incident illumination. Examples of materials that may form the coating layer 25 on a hypotenuse surface side of the prism 10 (3) include metals and dielectrics. Commonly used metal layers include aluminum, silver and gold. Dielectric layers are often fabricated from glass or fused silica (FS).

In one embodiment of the present invention, the prism 10(4) may be provided with a coating stack 25(1) that supports surface plasmon resonance (SPR) on the prism 10(4), as shown in FIG. 1D. In one embodiment, the prism 10(4) may be provided in an optical train 30 of an illuminator 50. The coating stack 25(1) may comprise a thin metal layer 25a and a dielectric layer 25b over that to generate a signal with a comb of resonances in which each resonance includes an absorption amplitude notch and an associated phase notch. In another embodiment, the coating stack 25(1) may comprise a thin metal layer overlaid with a thicker dielectric layer.

In operation, when light enters the prism 10(4) and it hits the hypotenuse of the prism 10(4) at a rather steep angle so that TIR occurs. This steep angle such as the angle "a" is generally referred to as a critical angle. The critical angle is an angle of the light at which it impinges a material and it is related to a refractive index of the material of which the prism 10(4) is comprised , for example. If the light hits the prism 10(4) at an angle smaller than the critical angle, it simply travels through as shown at the prism 10(1) in FIG. 1A. Of course, the light may refract or bend somewhat based on the type of material, but it essentially transmits through the prism 10(1). Upon hitting at the critical angle or any angle greater, the light gets totally reflected, as shown by the prism 10(2) in FIG. 1B. In other words, a 100% reflection may occur ideally with no significant loss of light since the hypotenuse surface of the prism 10(2) may act as an ideal mirror surface.

FIG. 1B schematically depicts a method for sensing pointing or angle or beam divergence of the optical beam 15. The method comprises providing within an optical train a transmissive optical element such as the prism 10(2) having a surface 20 to detect at least one of a beam angle "a'" or a pointing direction or the angle of incidence of the optical beam 15, the prism 10(2) supports total internal reflection (TIR) for measuring the beam angle "a'" or a pointing direction or the angle of incidence of the optical beam 15.

Referring to FIG. 1C, to increase a given angular sensitivity based on the total internal reflection (TIR) a portion of the surface 20 of the transmissive optical element such as the prism 10(3) may be coated for measuring a variation in the beam angle "a'" or a pointing direction or the angle of incidence of the optical beam 15.

Referring to FIG. 1D, the coating stack 25(1) that supports surface plasmon resonance (SPR) on the transmissive optical element such as the prism 10(4) may be provided to generate a signal with a comb of resonances. In this comb, each resonance includes an absorption amplitude notch and an associated phase notch. While the absorption amplitude notches may be separated evenly in angle but individual absorption amplitude notches exhibit an asymmetric absorption response across each notch. The coating stack 25(1) may have at least one physical and/or optical property that causes the optical beam 15 to change direction.

Figure 1E:
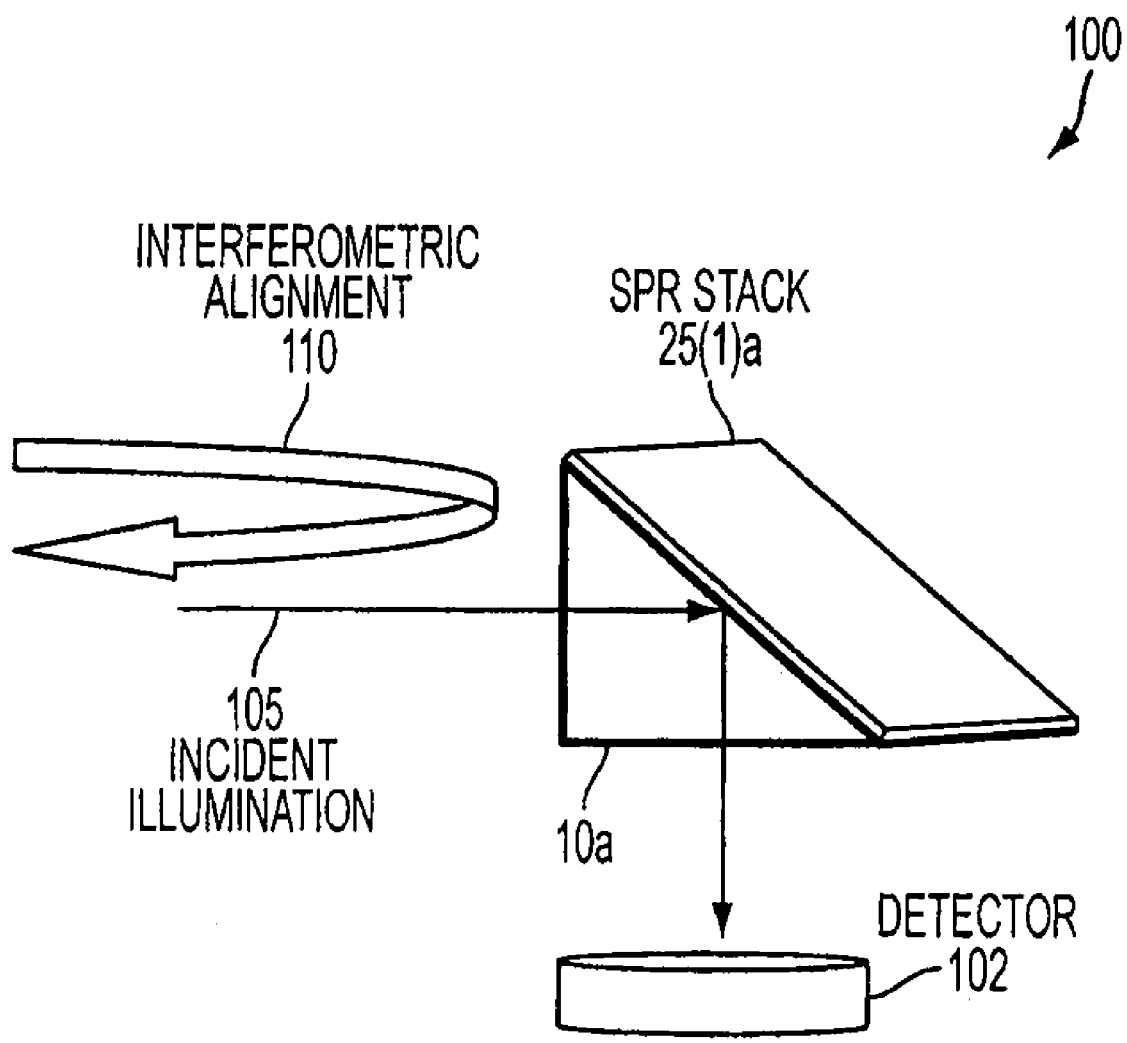

Referring to FIG. 1E, a beam pointing and/or divergence sensor 100 comprising an electronic optical detector 102 and an optical prism 10a with a SPR stack 25(1)a is illustrated according to one embodiment of the present invention. One example of the detector 102 is a photodiode. In a SPR pointing measurement example, an incident illumination 105 using an interferometric alignment 110 may be impinged on the optical prism 10a. For example, the incident illumination 105 using the interferometric alignment 110 may hit the SPR stack 25(1)a of the optical prism 10a at 45°. The electronic optical detector 102 may detect intensity of a light signal with 90%-10% light. The SPR stack 25(1)a may comprise a metal such as aluminum (AL) layer of 23 nm and a dielectric layer of Silicon dioxide ($SiO_2$) of 1 mm thickness.

The beam pointing and/or divergence sensor 100 for measuring optical beam pointing of the optical beam 15 may comprise the prism 10a having a surface being disposed within an optical train. The prism 10a may comprise a transmissive material that enables total internal reflection (TIR) for the optical beam, for example, the incident illumination 105. The detector 102 may electronically detect a variation in at least one of a beam pointing, a beam position, or divergence of the incident illumination 105.

As shown in one illustrative embodiment of FIG. 1E, a portion of the surface of the prism 10a includes a coating where the prism 10a receives the incident illumination 105 to measure at least one of a beam angle, a beam pointing direction, or divergence of the incident illumination 105. The coating may have at least one physical or optical property that causes the incident illumination 105 to change direction. This coating may enhance a rate at which a total internal reflection (TIR) transition between transmission and reflection occurs. The coating may comprise a multi-layer stack such as the SPR stack 25(1)*a*. Such a multi-layer stack may include a bi-layer stack of absorbing and transmitting optical materials. While the bi-layer stack may comprise a thin absorbing metal layer followed by a thicker dielectric layer, the thin absorbing metal layer and thicker dielectric layer of the bi-layer stack enable a waveguide. In this manner, the bi-layer stack as the waveguide enables surface plasmon resonance (SPR). The thicker dielectric layer may be a substantially plane parallel plate that is either vacuum deposited or sputtered. Alternatively, the plate may be optically contacted.

Figure 1F:
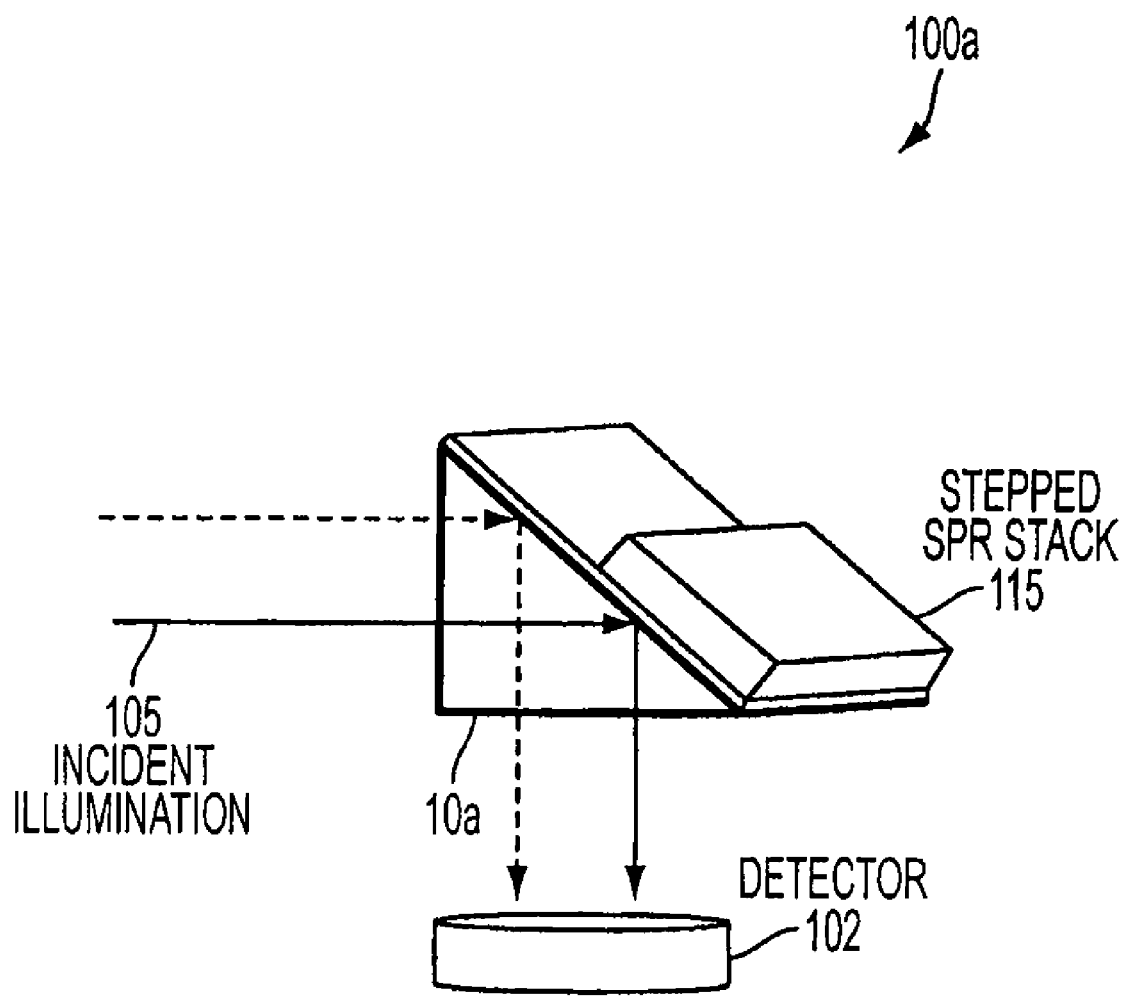

FIG. 1F illustrates a beam pointing and/or divergence sensor 100*a* comprising the electronic optical detector 102 and the optical prism 10*a* with the SPR stack 25(1)*a* having a stepped thickness stack shape for a SPR dielectric layer 115 according to one embodiment of the present invention. The incident illumination 105 may be scanned across different thicknesses of the SPR stack steps to detect various nominal angles and ranges of angle of the incident illumination. In this way, a coating or the SPR stack 25(1)*a* includes a dielectric layer in a shape of a stepped wedge such that the stepped wedge includes a first and a second portions with different thickness of the dielectric layer.

Figure 1G:
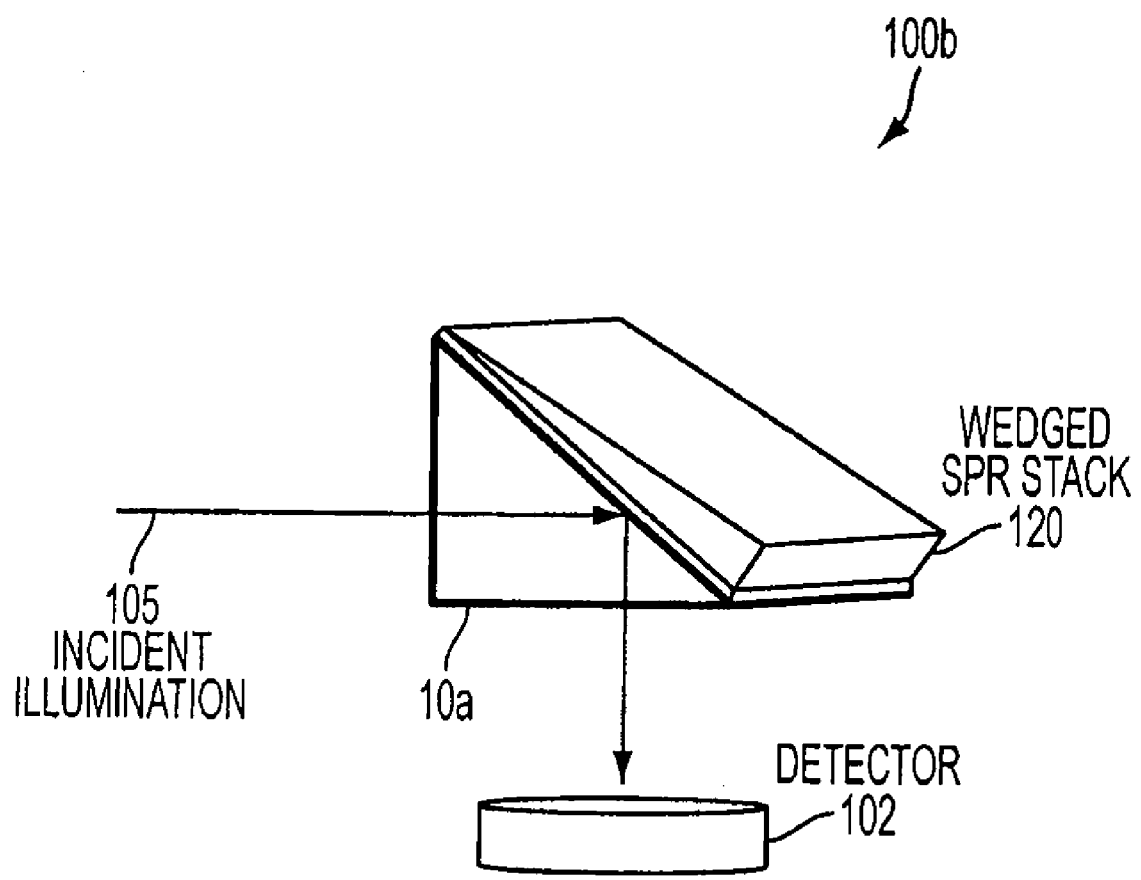

Referring to FIG. 1G, a beam pointing and/or divergence sensor 100*b* comprising the electronic optical detector 102 and the optical prism 10*a* with the SPR stack 25(1)*a* having a wedged SPR dielectric layer 120 is illustrated according to one embodiment of the present invention. In one embodiment, for example, the thicker dielectric layer may be a wedged plate. Scanning of areas different wedge thicknesses allows for a single sensor to act as a variable angle range sensor. In this way, a coating or the SPR stack 25(1)*a* includes a dielectric layer in a shape of a wedged plate. To provide a tunable range pointing and/or beam divergence sensor such as the beam pointing or divergence sensor 100*b*, the incident optical beam 15 may be scanned over a desired region of illumination on the wedged plate.

Figure 2:
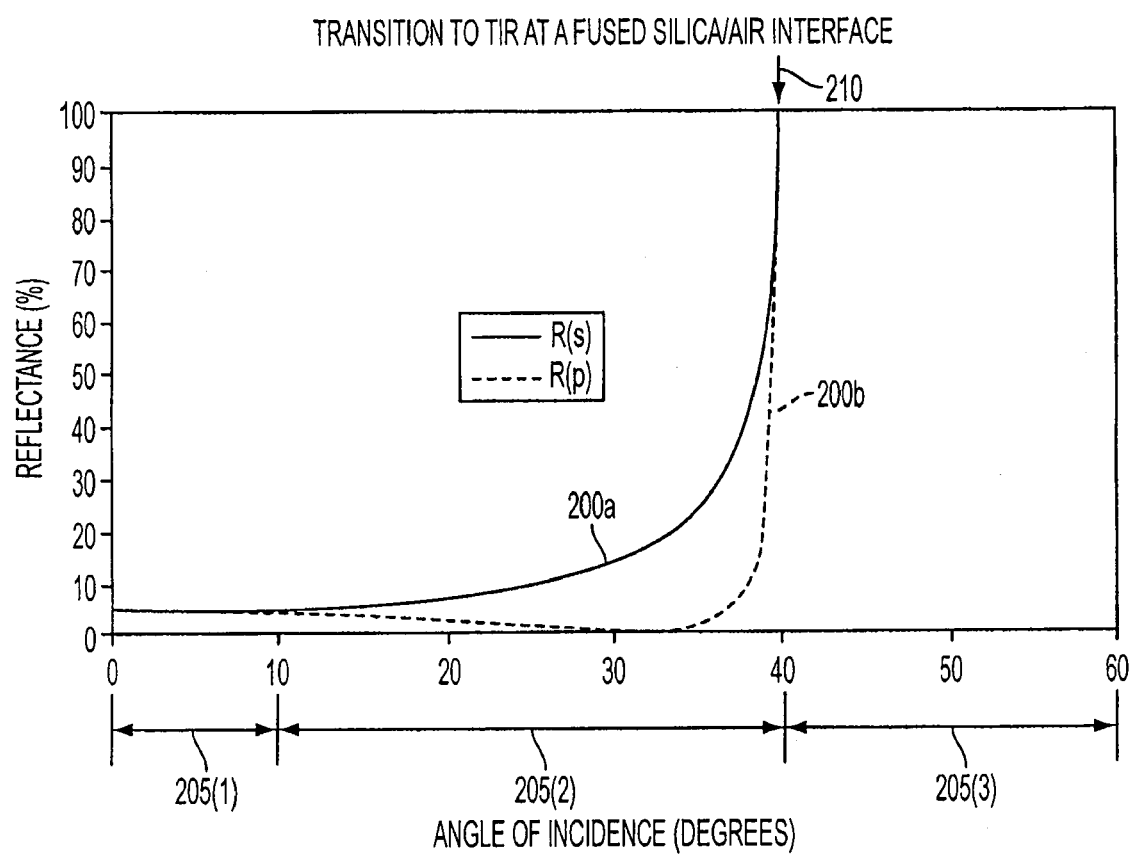

Referring to FIG. 2, a first plot 200*a* for a percentage (%) reflection of a S direction polarization R(s) is shown along with a second plot 200*b* for a % reflection of a P direction polarization R(p), according to one embodiment of the present invention. That is, FIG. 2 illustrates the TIR plot of percent reflection as a function of incident angle for a given wavelength of incident optical radiation. The transition between transmitted light and totally internally reflected light is seen to occur over the angular range of approximately 0 to 40 milliradians (mrads). For example, a transition to TIR at a angle off-critical point marked by an arrow 210 is shown at a fused silica/air interface. In a fist angle of incidence range 205(1) of 0 to 10 mrads, no light is reflected. But in a second angle range 205(2) of 10 to 40 mrads, the light transitions to get reflected. Finally, in a third angle range 205(3) of 40 to 60 mrads, the light is totally reflected starting at a angle off-critical point marked by the arrow 210. That is, ideally 100% of the light is being reflected in the third angle range 205(3).

For using the TIR with the angle off-critical point 210 as a beam pointing and/or divergence monitor, in the second angle range 205(2) of 10 degrees to 40 degrees the pointing and/or angle of incidence changes for the light or the optical beam 15 aimed at the prism 10(2) or 10(3) which may be moving relative to the light or the light may be moving relative to the prism 10(2) or 10(3). That is, beam pointing can be changing as a function of an angle and S and/or P polarization. But if the beam pointing angle "a" of the optical beam 15 is changing from 10 degrees towards 40 degrees (i.e., the beam angle "a" being 90° at a point when the optical beam 15 is perpendicular to the hypotenuse surface 20 of the prism 10(2), by noting the second plot 200*b* it may provide a given corresponding % of reflection relative to a particular beam pointing angle. For example, at 10 degrees of beam pointing angle, a 5% reflection would be present but at 30 degrees of the beam pointing angle, a 10% reflection would be present or at 40 degrees a 100% reflection.

By using and/or measuring the amount or % of the beam light reflected in a reflected beam that may become a pointing totally reflected beam as a gauge of a beam angle, a beam pointing sensor may be formed according to one embodiment of the present invention. For example, the beam pointing sensor may operate in a 0 mrads to 40 degrees or ±40 degrees range of a beam pointing angle and/or angle of incidence by measuring this angle in the desired range.

By measuring the amount or % of the beam light reflected for a plurality of angles of incidence, a beam divergence sensor can be formed according to an embodiment. For example, the beam divergence sensor can operate in a 0 mrads to 40 degrees or ±40 degrees range of angle of incidence.

As shown in FIG. 1D, the prism 10(4) may provide a SPR-assisted TIR according to one embodiment of the present invention. On the hypotenuse surface 20 of the prism 10(4), the thin metal layer 25*a* may be deposited or coated and on top of this layer a relatively thicker layer such as the dielectric layer 25*b* may be coated or deposited. By selecting a desired optically transmissible material with a suitable refraction index for the prism 10(4), e.g., using glass, a resonance of the stack 25(1) may be selected such that when the light impinges the layers 25*a* and 25*b* it would be normally totally internally reflected. Some of the light may get absorbed by the metal layer 25*a* and travel within as a waveguide along a flat surface of the layer, creating an angular resonance, in other words, SPR.

Figure 3:
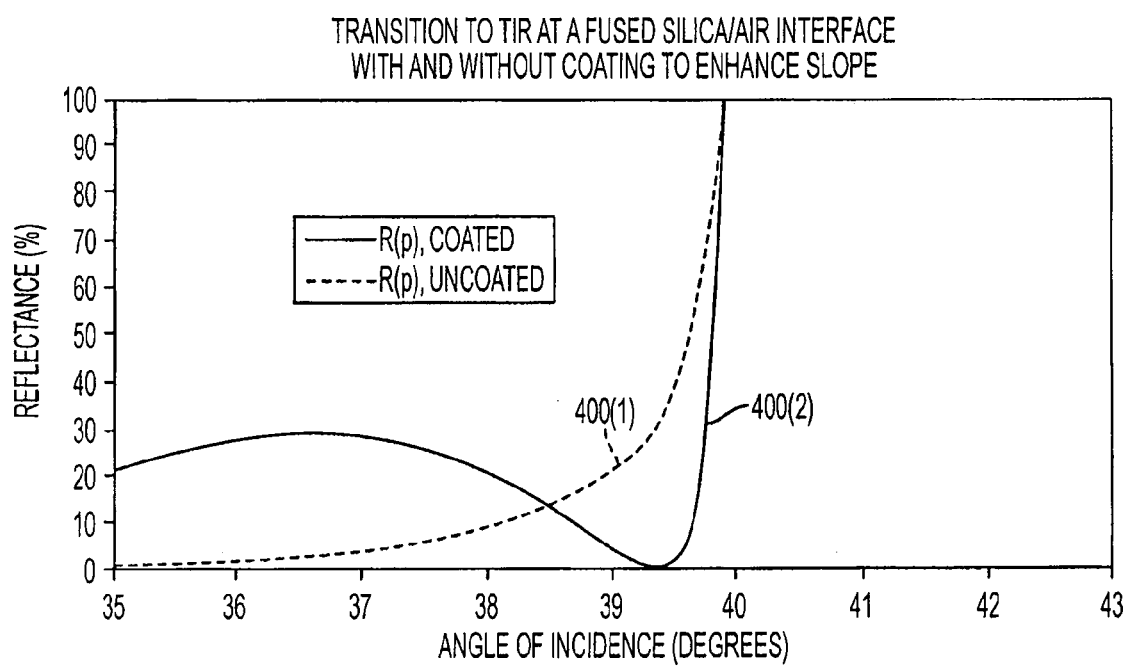

Referring to FIG. 3, it schematically illustrates an uncoated plot 400*a* and the TIR with an enhancing optical coating plot 400*b* of percent reflection as a function of incident angle for a given wavelength of incident optical radiation according to one embodiment of the present invention. The enhancing optical coating plot 400*b* is seen to narrow the angular response of the TIR transition. This transition to TIR is shown at a fused silica/air interface with and without coating to enhance slope.

Figure 4:
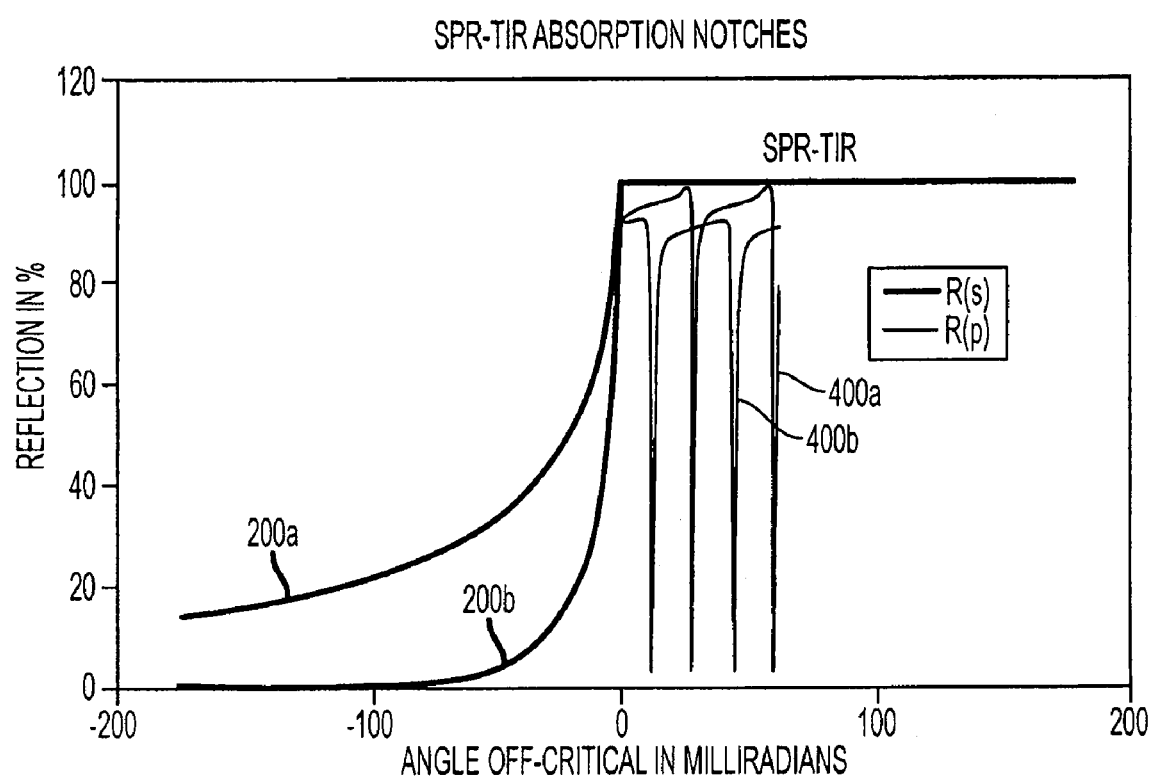

Referring to FIG. 4, it schematically illustrates a TIR-SPR plot of percent reflection as a function of incident angle for a given wavelength of incident optical radiation according to one embodiment of the present invention. The plot for SPR as a function of illumination incidence angle is shown with a resonance of relatively tighter or much smaller angular range in which light goes from totally reflected to totally absorbed according to one embodiment of the present invention. As can be seen in FIG. 4, the resonance occurs in a shape of a comb of notches as a periodic phenomenon being a function of an angle. The two plots of different R and S polarizations illustrated as the R(s) curve 200*a* and the R(p) curve 200*b* are offset by 180°. A first comb 400*a* for the S polarization R(s) and a second comb 400*b* for the P polarization R(p) are alternating spaced in a beam pointing angle scale. The plot for SPR illustrates the comb of notch absorption resonances created by the SPR effect. The SPR is seen to narrow the range of angular selectivity into the urad regime.

The sensor shown in FIG. 1E uses the electronic detector 102 for detecting pointing and/or angle of incidence of the optical beam 15. The SPR stack 25(1)*a* generates a signal with a comb of resonances in which each resonance includes an absorption amplitude notch and an associated phase notch. The absorption amplitude notches which are separated evenly in angle but individual absorption amplitude notches exhibit an asymmetric absorption response across each notch.

Figure 5:
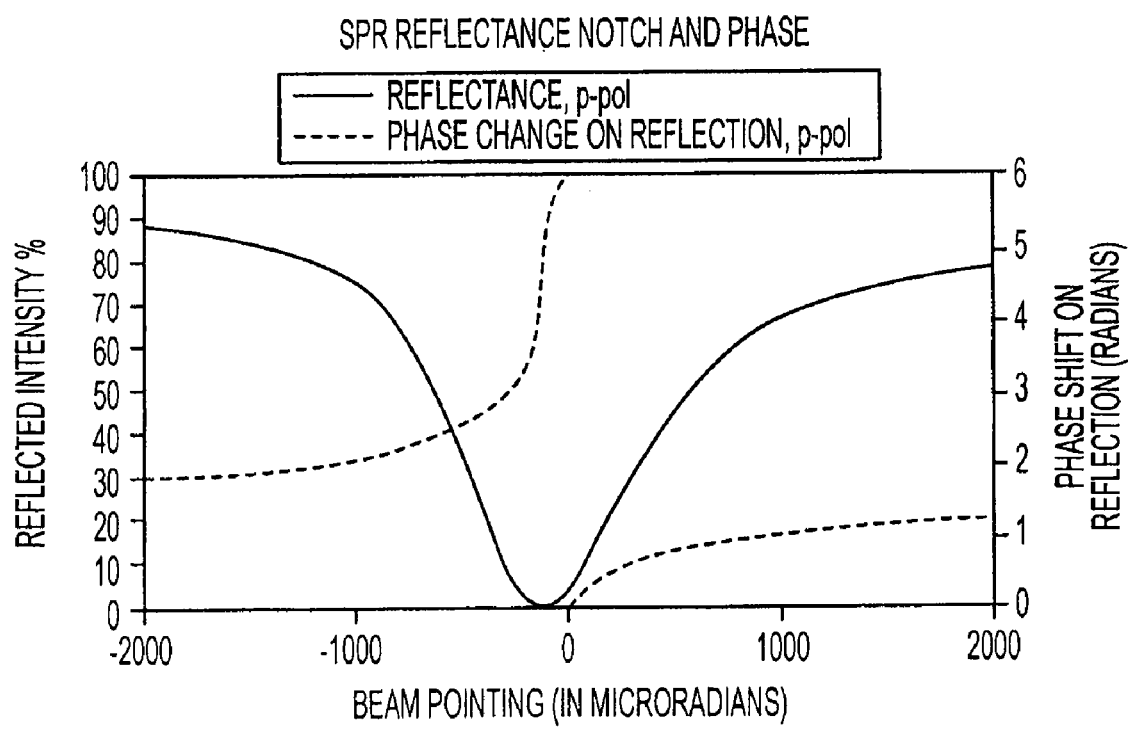

FIG. 5 schematically represents a single SPR resonance notch and its associated phase shift upon reflection according to one embodiment of the present invention. The asymmetry of the absorption can be seen as a function of the positive and negative side of the resonance notch. The coating stack 25(1) that supports surface plasmon resonance (SPR) may further comprise a dielectric material of a particular thickness. By tuning a dielectric material thickness of the coating stack 25(1), at least one of an absorption notch angular location or a angular notch width may be optimized for selecting a nominal beam angle of incidence and a beam angle of incidence range. By tuning an absorptive material thickness of the coating stack 25(1), an absorption amplitude notch depth of the SPR may be optimized for increasing a signal-to-noise-ratio (SNR) of a beam pointing and/or divergence measurement. In this way, the electronic detector 102 uses the asymmetry of the signal to determine a positive or a negative angular error.

Figure 6:
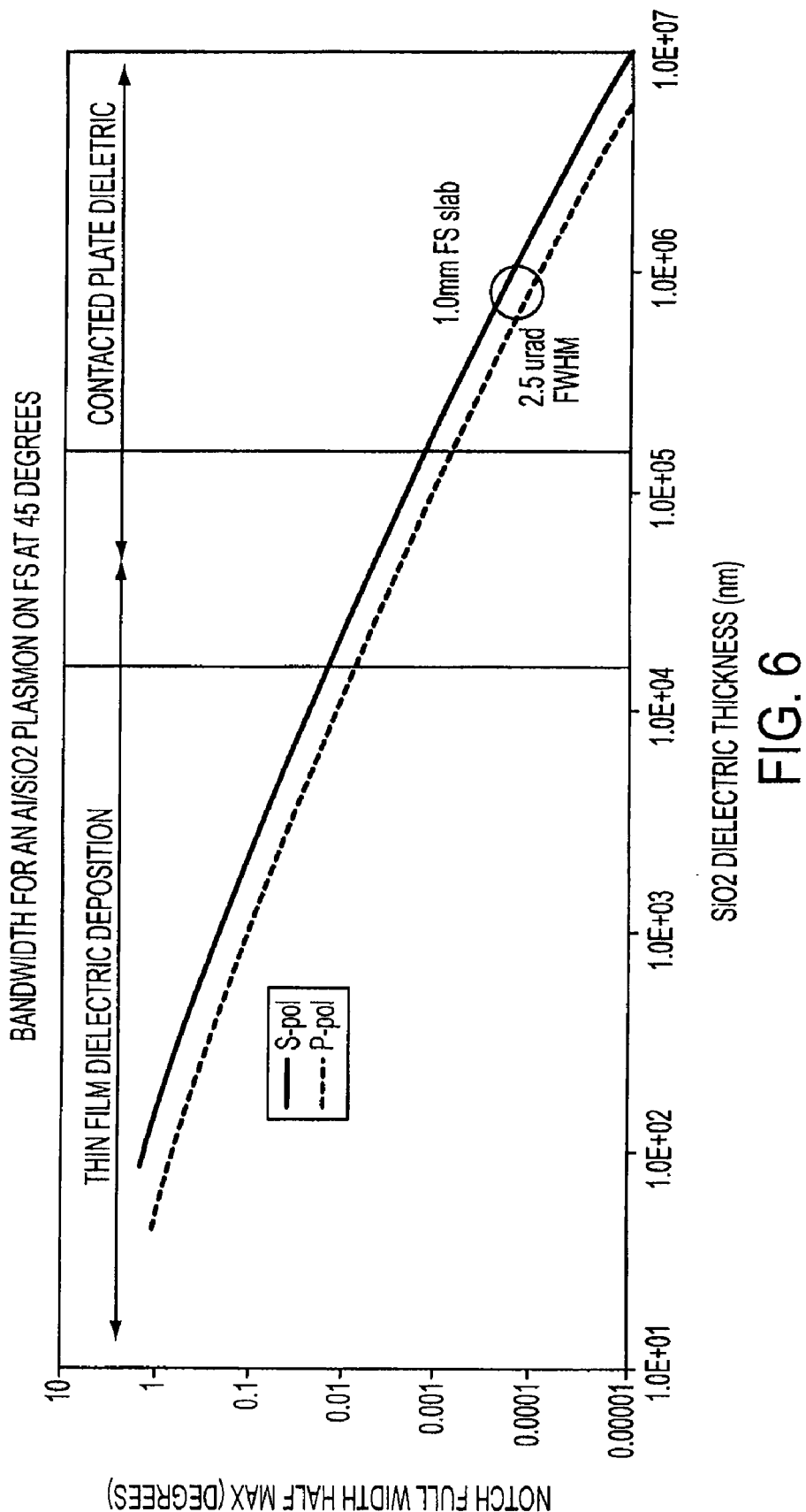

FIG. 6 schematically illustrates the relationship between the SPR dielectric film thickness, the nominal position of the absorption notch angle, and the angular width of the SPR absorption notch according to one embodiment of the present invention.

Figure 7:
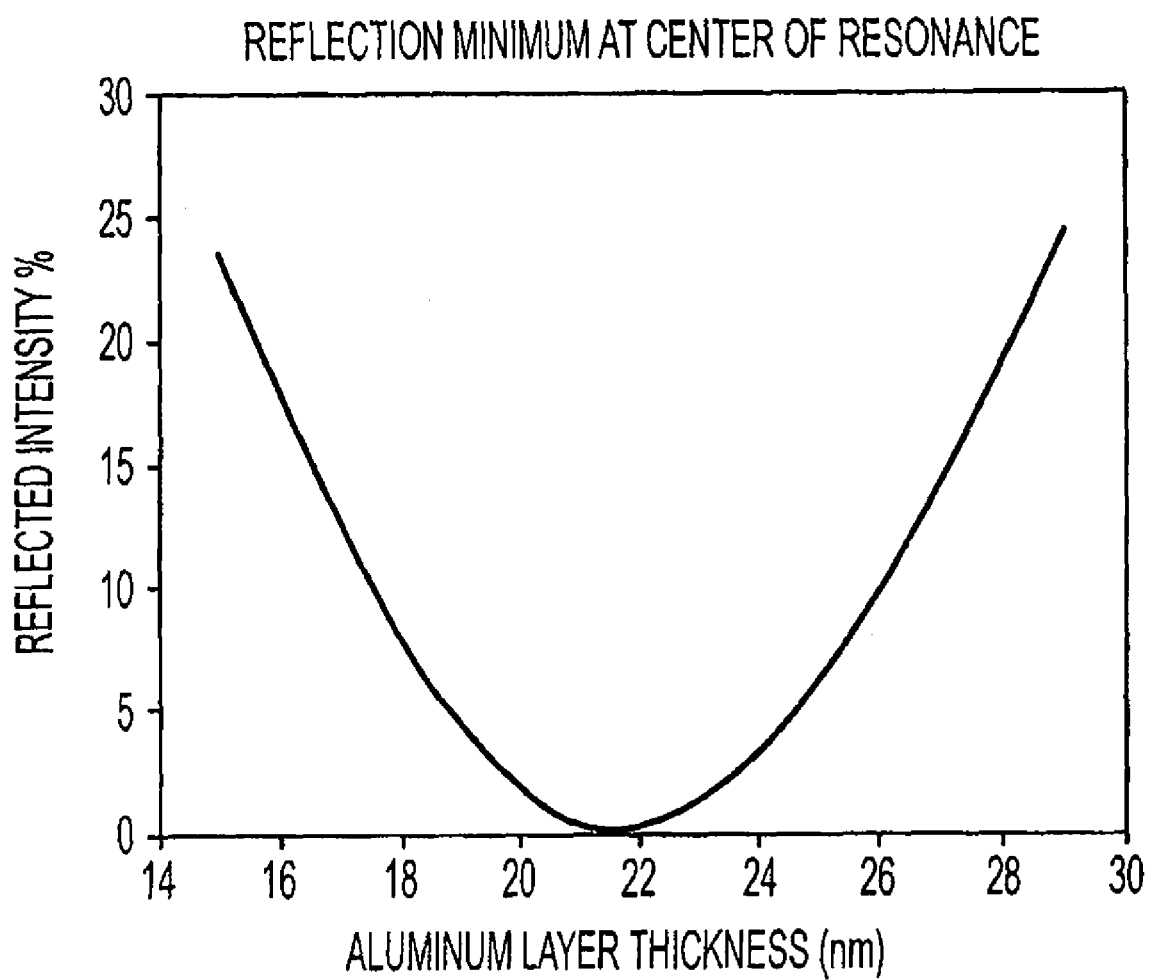

FIG. 7 schematically illustrates the tuning of the SPR absorption layer thickness to optimize the SPR absorption notch depth according to one embodiment of the present invention.

Figure 8:
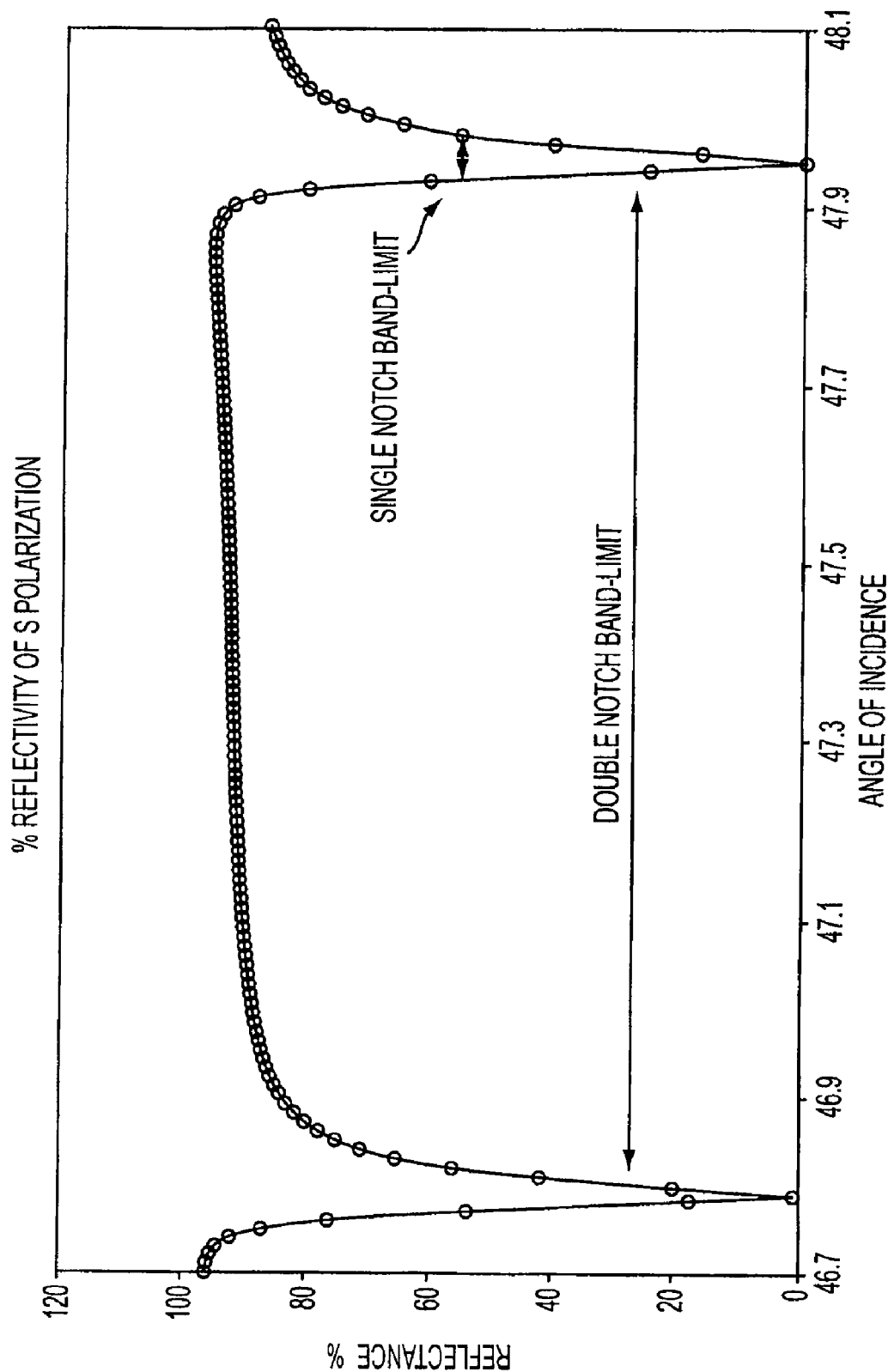

FIG. 8 schematically illustrates limiting the range of the incident illumination to one SPR absorption notch according to one embodiment of the present invention. FIG. 8 further illustrates limiting the range of the incident illumination to two adjacent SPR absorption notches for the purpose of creating an angle range limiting device. That is, tuning an absorptive material thickness of the coating stack 25(1) entails limiting a range of an incident illumination angle to one absorption amplitude notch of the comb of resonances. The range of an incident illumination angle may be limited by configuring a range of an incident illumination angle to a limit of at least two adjacent absorption amplitude notches of the comb of resonances for acting as an angle range limiter.

Figure 9A:
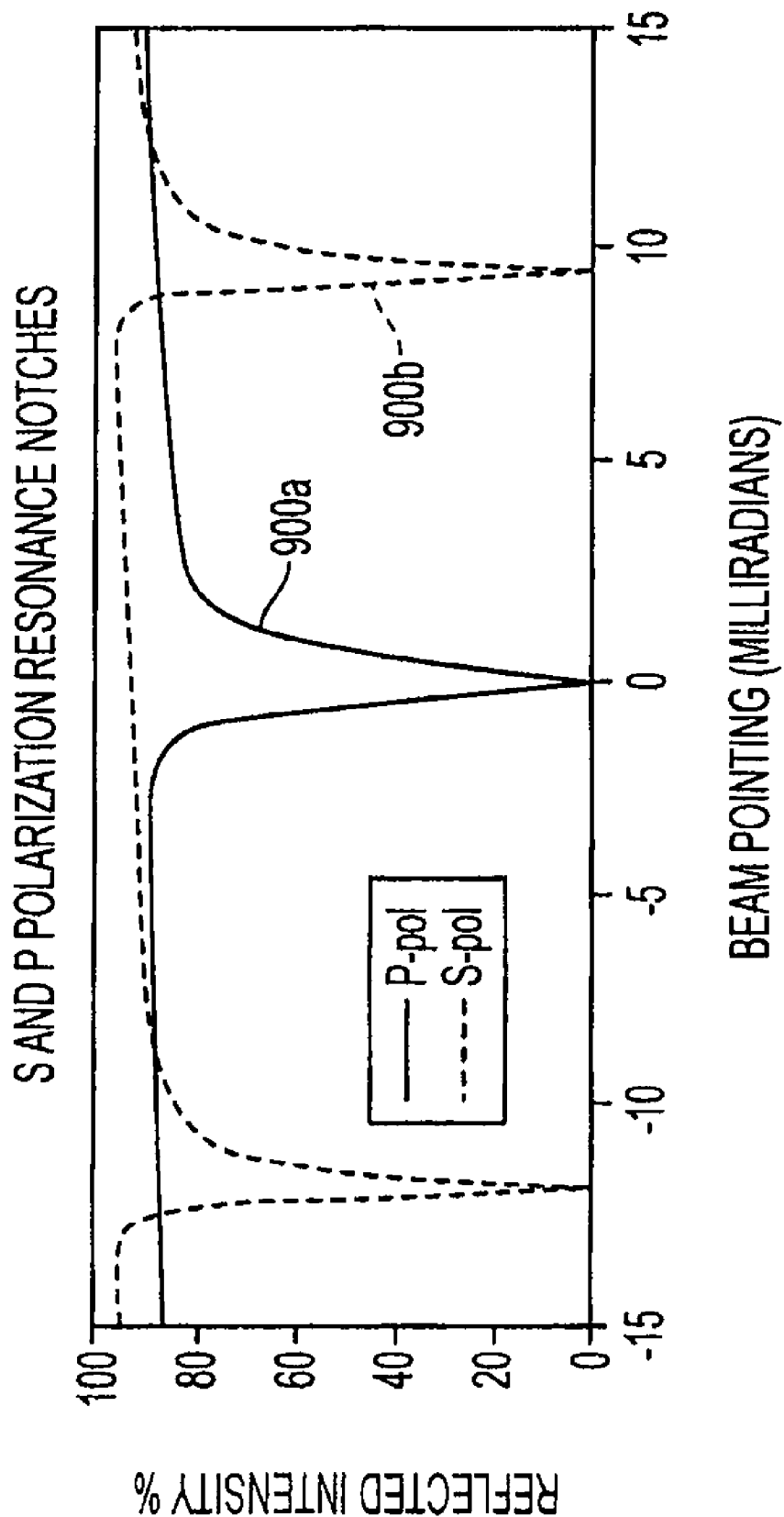

FIG. 9A schematically shows a plot of S and P polarization resonance notches P-pol 900a and S-pol 900b of a reflected intensity percent (%) against a beam pointing and/or angle of incidence in −15 to +15 milliradians range according to one embodiment of the present invention. The plot of SPR is shown as a function of illumination polarization direction. The comb of resonances may be angularly located as a function of a polarization direction whereas S and P polarization absorption combs may be 180 degrees out of phase with respect to one another. The orthogonal polarization directions are seen to be 180 degrees out of phase.

Figure 9B:
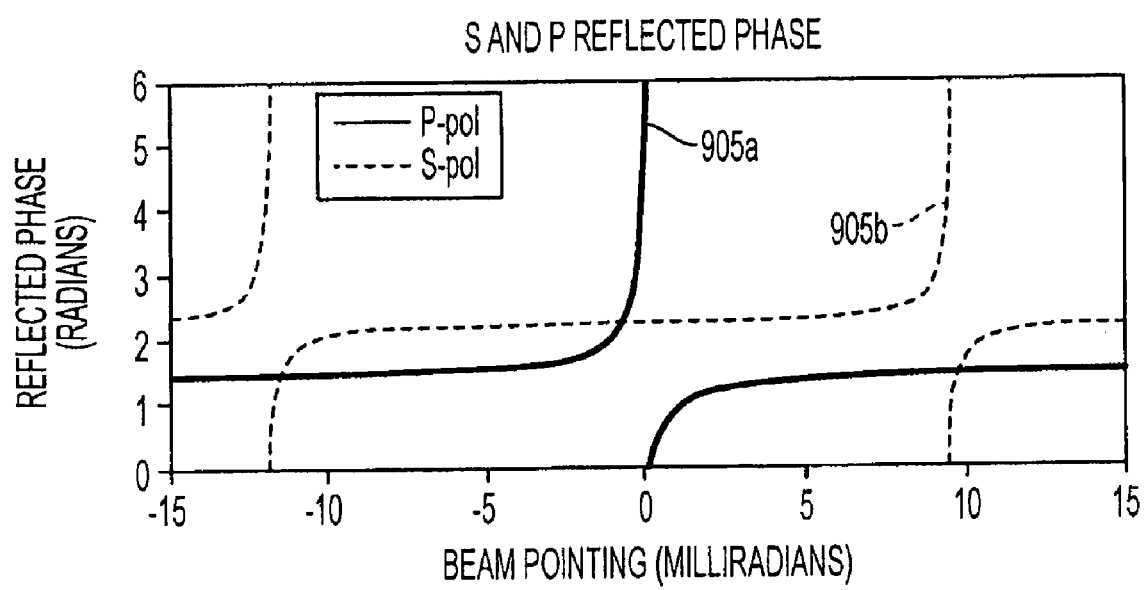

FIG. 9B schematically shows a plot of S and P reflected phase P-pol 905a and S-pol 905b of a reflected phase in which the SPR resonance notches are 180 degrees out-of-phase according to one embodiment of the present invention. The plot of S and P reflected phase P-pol 905a and S-pol 905b is shown within a 0 to 6 radian range as a function of beam pointing and/or angle of incidence in the −15 to +15 milliradians range.

Figure 10A:
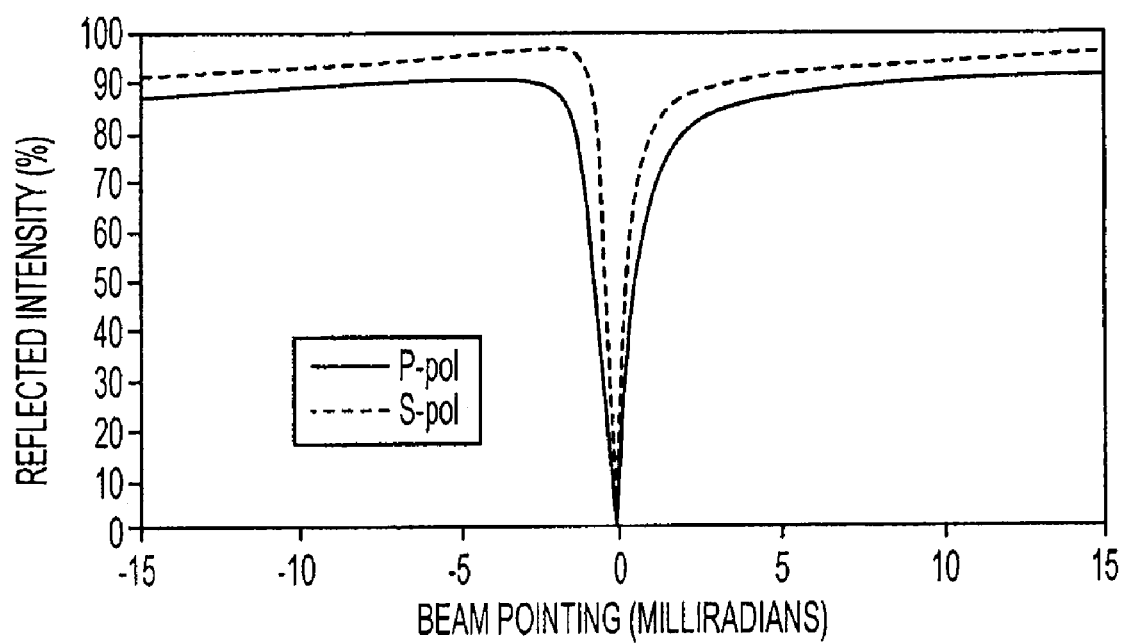

FIG. 10A schematically shows a plot of SPR in which the SPR absorption resonance notches are in phase as a function of illumination polarization direction according to one embodiment of the present invention. The orthogonal S and P polarization directions are seen to be in phase. This configuration allows for the concurrent detection of the orthogonal polarization directions using the same nominal incident illumination angle.

Figure 10B:
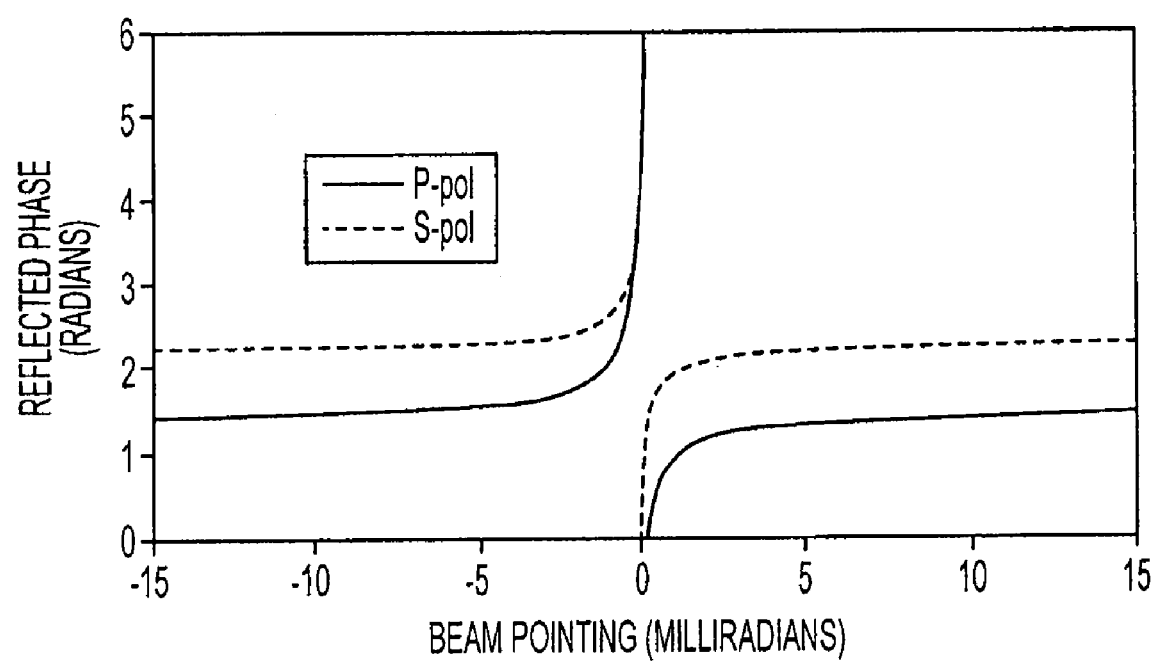
Figure 11:
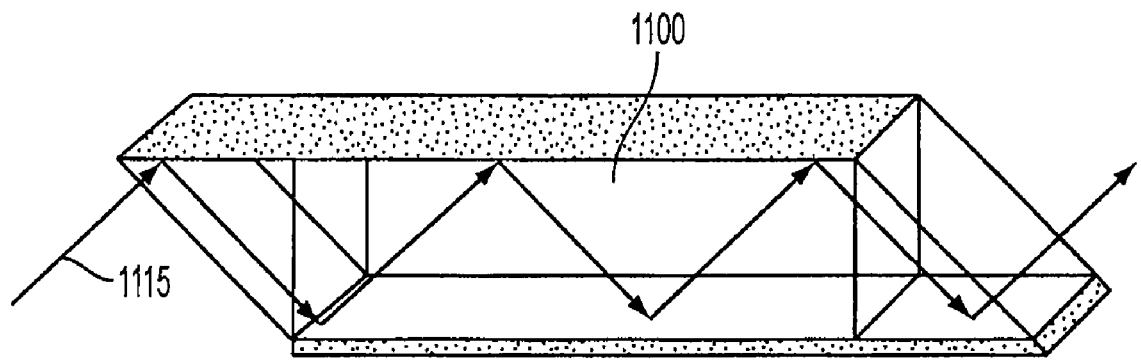

FIG. 10B schematically shows a plot of SPR optical phase in which the SPR phase plots are in phase as a function of illumination polarization direction according to one embodiment of the present invention. The orthogonal S and P polarization directions are seen to be in phase. This configuration allows for the concurrent detection of the orthogonal polarization directions using the same nominal incident illumination angle FIG. 11 schematically illustrates an optical embodiment further providing a cascade of optical stacks 1100 to enhance the separation of narrow optical illumination angles according to one embodiment of the present invention. The cascaded stack embodiment allows for the enhanced detection of an incident optical beam 1115 with angular extent or numerical aperture (NA) of substantially larger than the nominal capture range of the beam pointing sensor and/or divergence sensor. In this way, the cascade of optical stacks 1100 may be provided in the coating stack 25(1) to enhance separation of narrow optical angles. Accordingly, multiple coatings of the bi-layer stack may be cascaded to enhance the beam angle of incidence detection. The cascaded coatings of the bi-layer stack may be configured to provide a coated TIR surface followed by an SPR surface, limiting the angular width of the incident optical beam to be detected.

Figure 12:
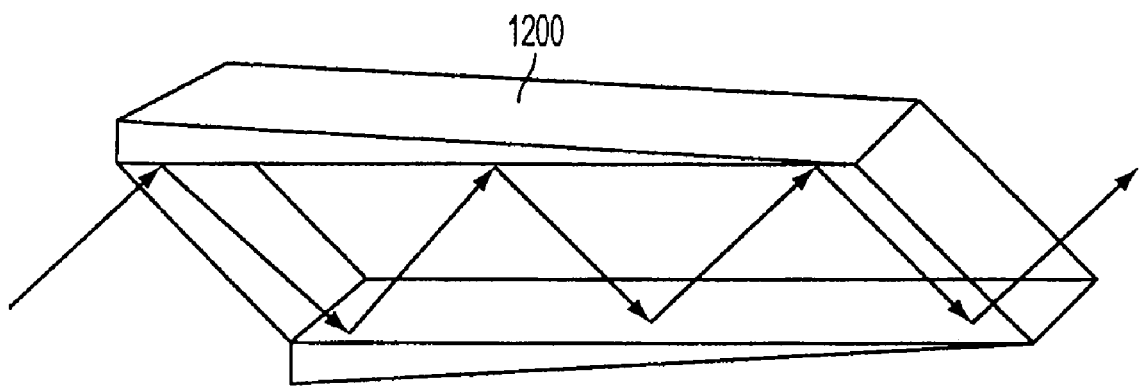

FIG. 12 schematically illustrates a wedged arrangement 1200 of FIG. 11 according to one embodiment of the present invention. The wedged arrangement 1200 may use the separation of narrow optical angles to enhance detection of one or more optical beams with angular extent or numerical aperture (NA) substantially larger than a capture range of a beam pointing and/or divergence sensor.

Figure 13:
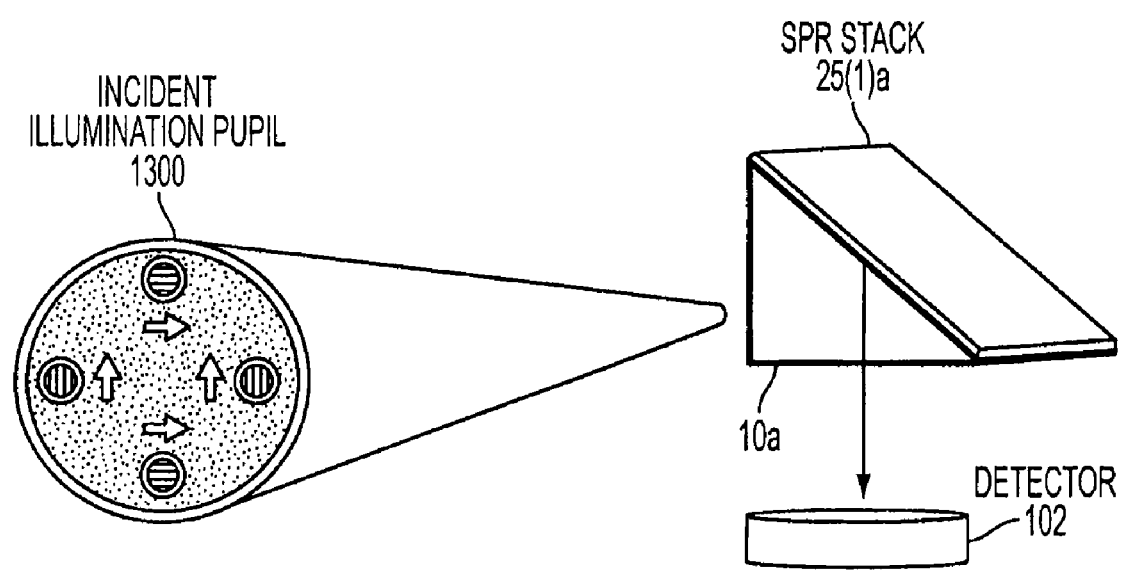

FIG. 13 schematically illustrates separating of narrow illumination angles via manipulation of the intensity distribution of an illumination pupil 1300 of an optical system that delivers the optical beam 15 to be measured according to one embodiment of the present invention. FIG. 13 further illustrates the manipulation of the intensity distribution of the illumination pupil 1300 of the optical system to be measured. This manipulation of the intensity distribution of the pupil is polar in spatial extent as regions of a pupil intensity are separate and discrete subsections of the pupil. In this example, the pupil is limited to narrow poles of intensity that are separate and discrete pupil subsections of orthogonal S and P polarization. That is, the discrete subsections of the pupil have orthogonal polarization orientations.

Figure 14:
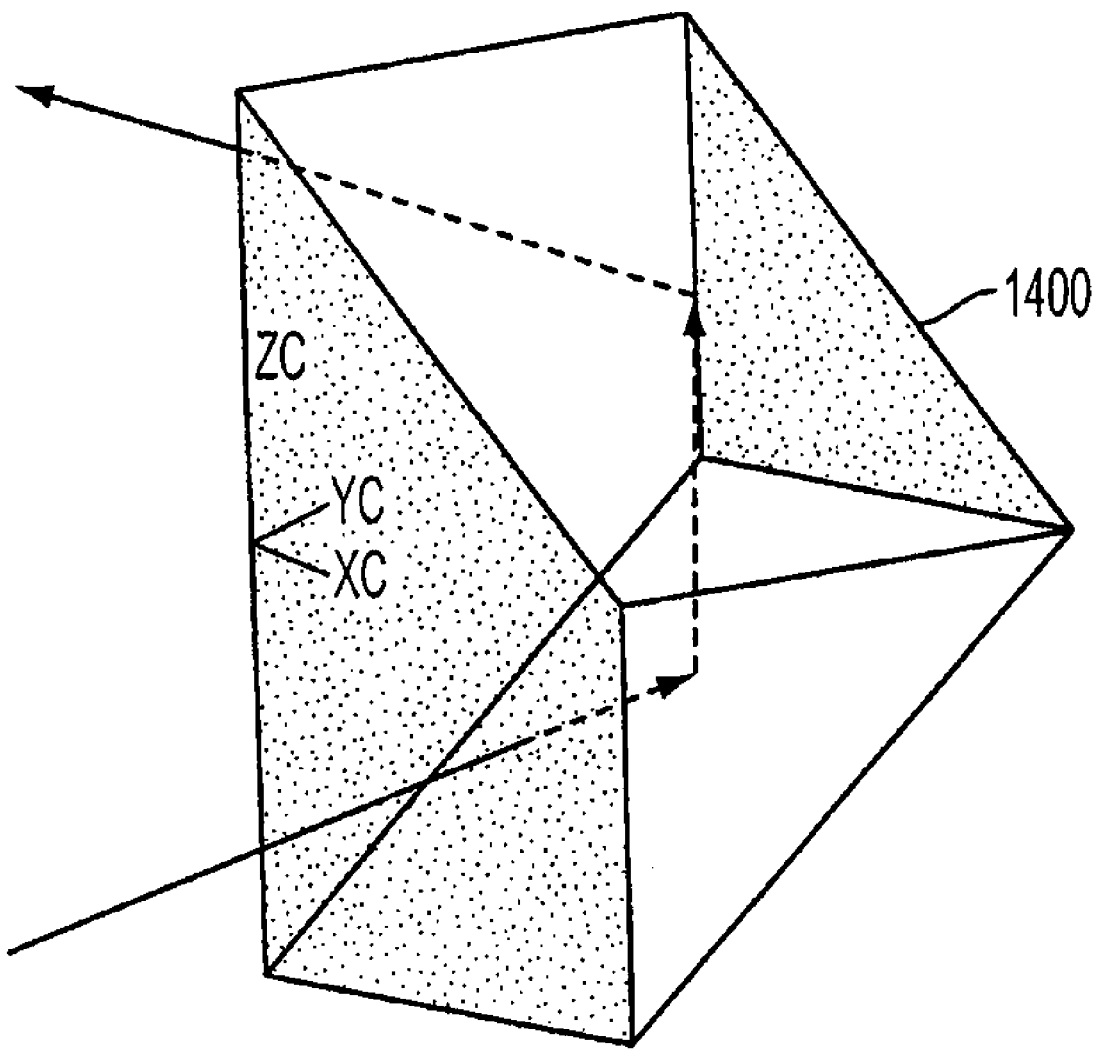

FIG. 14 schematically illustrates a combined X and Y prism 1400 according to one embodiment of the present invention. The cascaded SPR surfaces sequentially absorb nominal beam angles in the X and Y direction, respectively. This combined X and Y prism 1400 uses separate S and P polarizations to distinguish X from Y directional beam pointing and/or divergence. That is, a sensor may include the combined X and Y prism 1400 to separate S and P polarizations for distinguishing X from Y directional beam pointing and/or divergence. In such a sensor, a polarizing optical element may be used to distinguish between X and Y polarization directions.

Figure 15A:
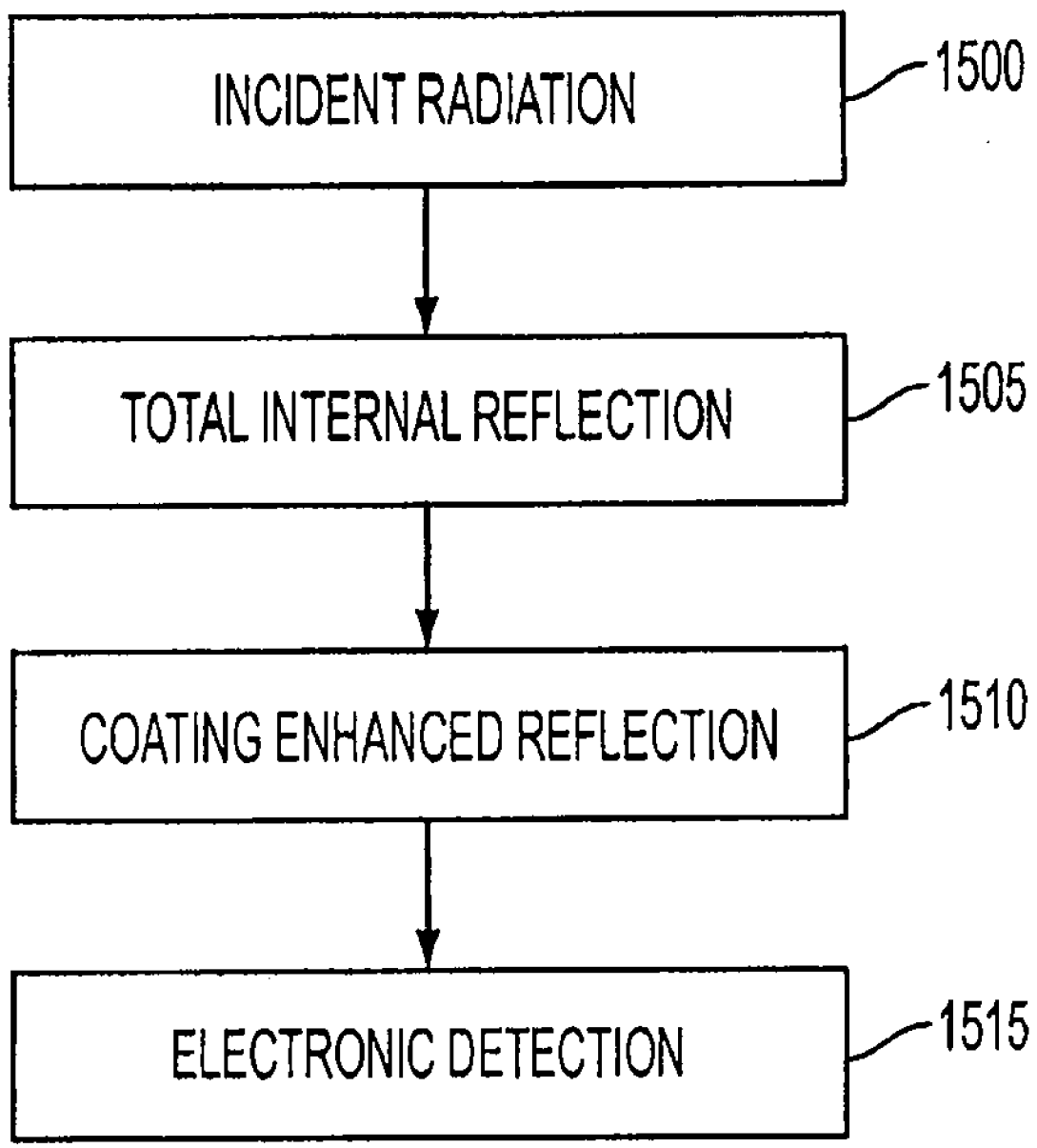

FIG. 15A schematically shows a block diagram of a method of using an apparatus such as the beam pointing sensor and/or divergence sensor 100a for optical beam pointing and/or divergence measurement according to one embodiment of the present invention. At block 1500, an incident radiation may be provided to the beam pointing sensor 100a. At block 1505, total internal reflection (TIR) may be provided using the SPR stack 25(1)*a*. A coating enhanced reflection may be provided using a coating in the SPR stack 25(1)*a*, as shown in block 1510. Finally, the electronic optical detector 102 may provide electronic detection at block 1515 in the beam pointing sensor 100*a*.

Figure 15B:
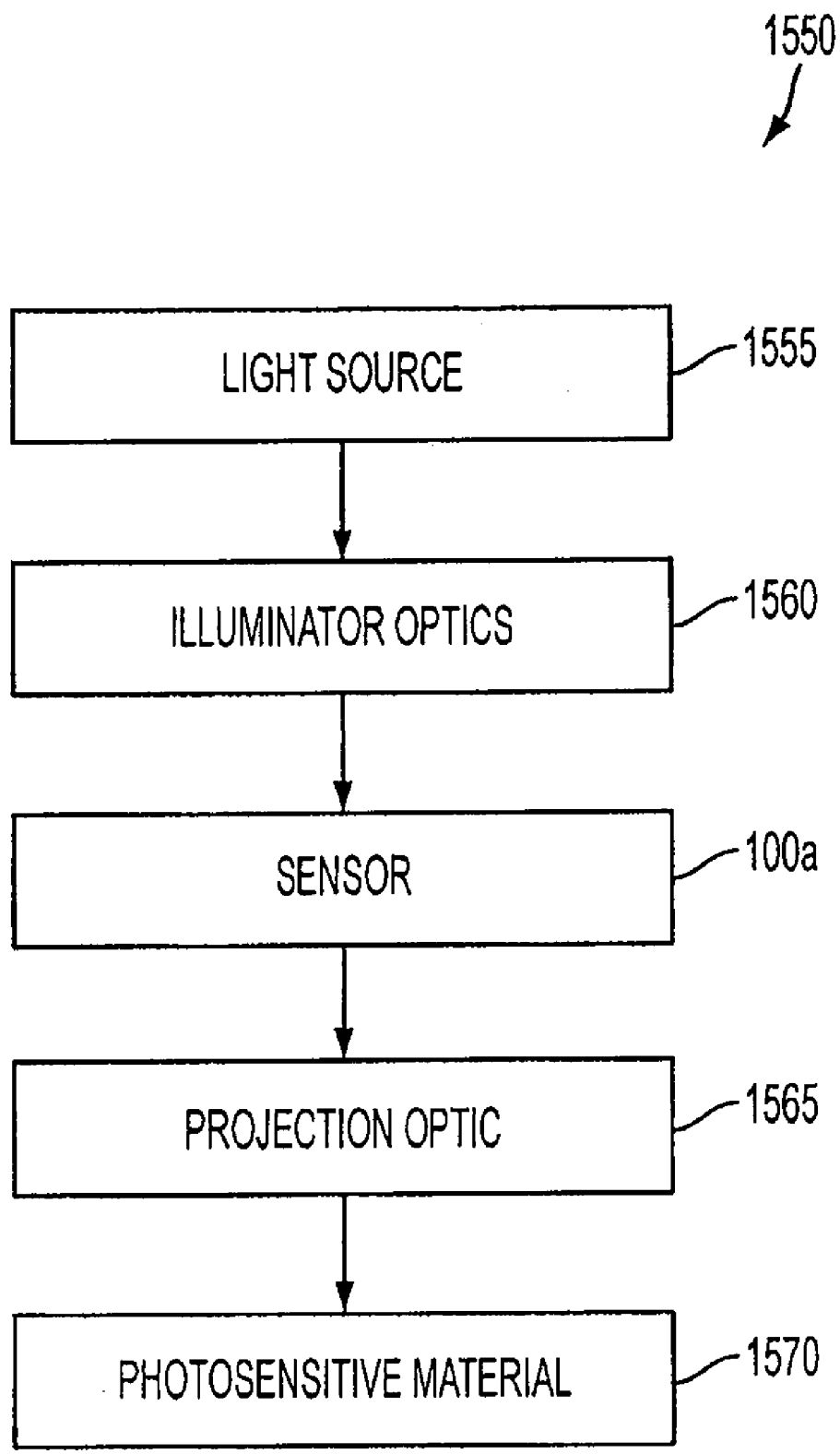

FIG. 15B schematically shows a litho tool 1550 according to one embodiment of the present invention. An apparatus such as the beam pointing sensor 100*a* may optically monitor a beam of light in a lithographic imaging system such as the litho tool 1550. The litho tool 1550 may comprise a light source 1555, an illumination optics 1560, a projection optics 1565 to process and/or expose a photosensitive material 1570.

The litho tool 1550 may further comprise the beam pointing sensor 100*a* for measuring a variation in at least one of a beam pointing, a beam position, or beam divergence of the beam of light. The beam pointing sensor and/or divergence sensor 100*a* may include an optics such as the optical prism 10*a* configured to provide total internal reflection (TIR) that enables a relatively high angular sensitivity in measuring the variation in the at least one of a beam pointing or a beam position of the beam of light. The beam pointing sensor and/or divergence sensor 100*a* may further include a first detector such as the electronic optical detector 102 arranged relative to the optics such as the optical prism 10*a* to electronically detect the variation of the beam of light and/or beam divergence.

The beam pointing sensor and/or divergence sensor 100*a* may include an optical coating that enables a rapid transmission cut-off as a function of an incident angle of the beam of light. The optics such as the optical prism 10*a* may have the optical coating to provide total internal reflection (TIR) and form a band-pass monitor.

Figure 16:
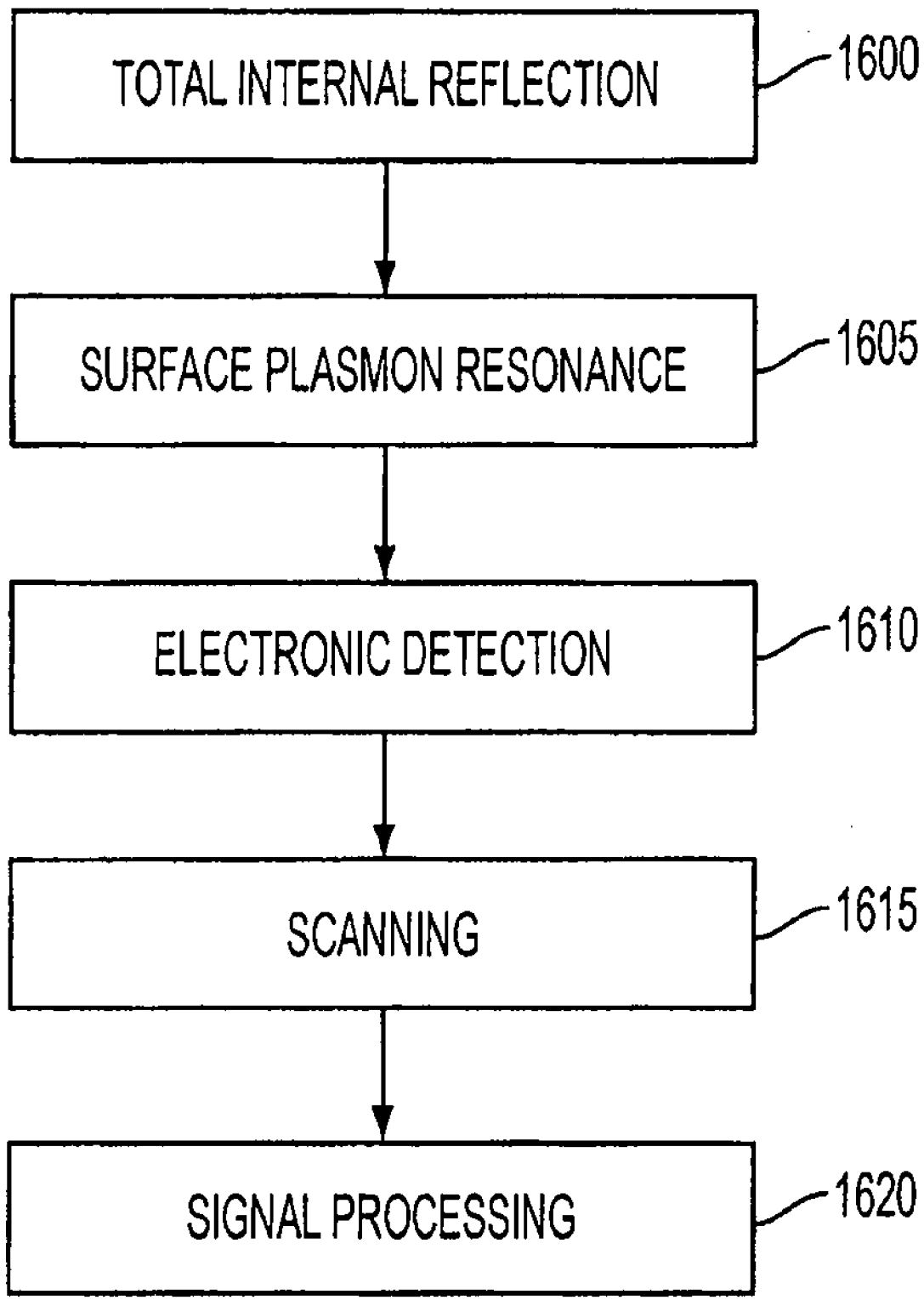

FIG. 16 schematically shows a block diagram of the method of FIG. 15A with additional optional steps according to one embodiment of the present invention. At block 1600, TIR may be provided and SPR may be obtained in block 1605. The beam of light may be electronically detected as shown in block 1610. Scanning may be performed at block 1615 with any signal process being completed at block 1620.

Figure 17:
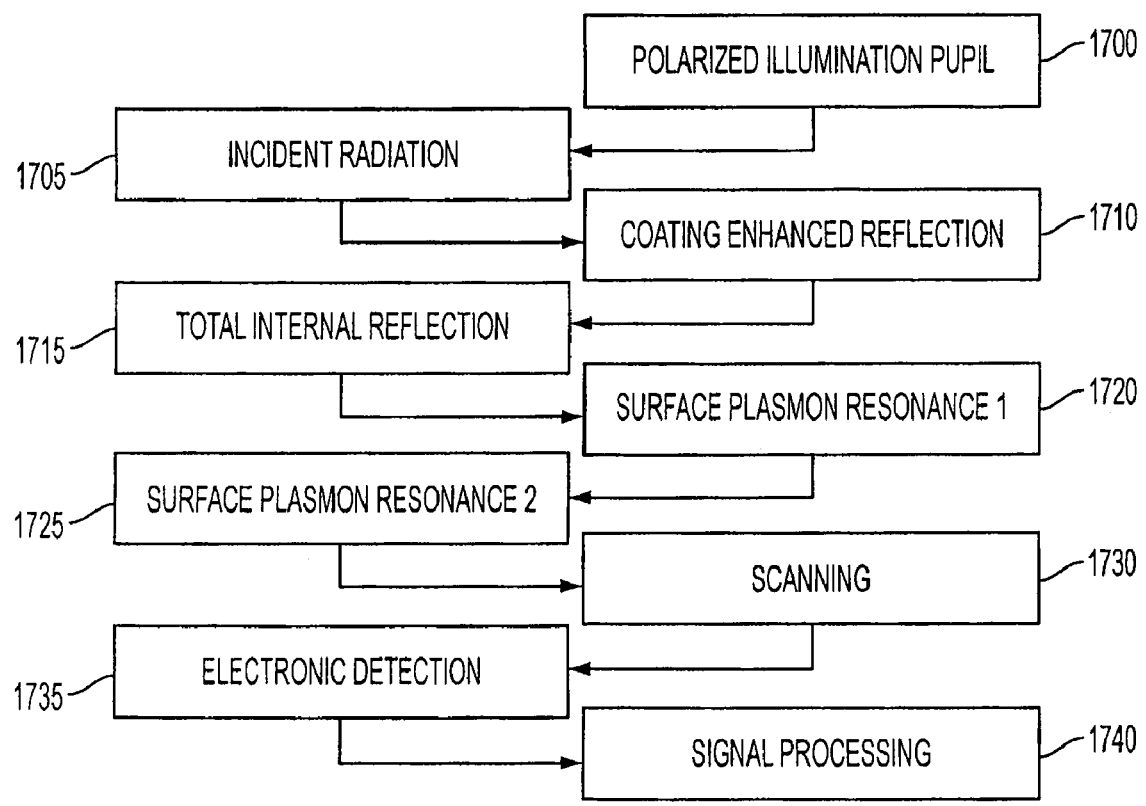

FIG. 17 schematically is a block diagram including polarization and a cascaded SPR sensor according to one embodiment of the present invention. A polarized illumination pupil may be provided at block 1700. At block 1705, an incident radiation may be directed. A coating enhanced reflection may be obtained in block 1710. Likewise, a total internal reflection may be obtained in block 1715. At block 1720, SPR 1 may be provided and at block 1725 SPR2 may be provided. Scanning may be carried out at block 1730. While the electronic detection may be accomplished at block 1735 with any signal processing completed at block 1740.

Figure 18:
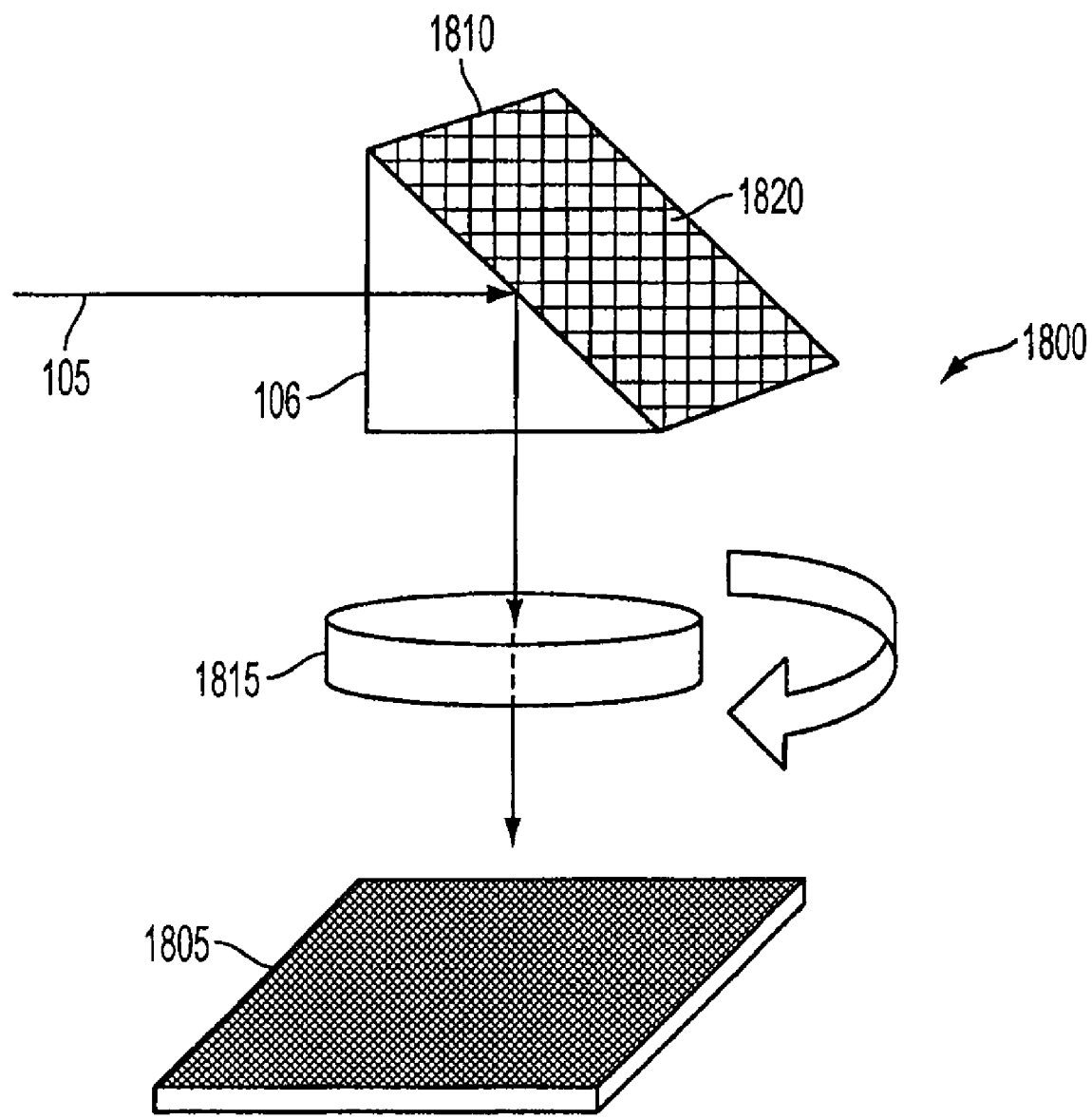

FIG. 18 schematically shows a spatially-distributed beam pointing sensor and/or divergence sensor 1800 wherein the electronic optical detector 102 includes a photodiode array 1805, thus detecting various spatially-distributed sensor responses across a prism surface 1810 of a prism 10*b* according to one embodiment of the present invention. This embodiment includes an optical polarizing element 1815 between a SPR assembly and the electronic optical detector 102 comprises a detector array such as the photodiode array 1805. Such an array of electronic detectors may detect pointing or both angle of incidence and reflected intensity of the optical beam 15. The photodiode array 1805 may detect various spatially-distributed sensor responses across the surface 1810 of the prism 10*b*.

Prism surface 1810 has a spatial-distributed SPR stack surface pattern. Different subsections of a patterned area 1820 may be formed with unique functionality. In this fashion, the spatially-distributed beam pointing sensor and/or divergence sensor 1800 with combined functionality may be addressed by interrogating individual subsections of the patterned area 1820 surface. As an example, adjacent subsections may be devised to detect increasingly larger or smaller nominal beam angles of incidence. In particular, a bi-layer stack may be configured as at least one of laterally defined or patterned such that subsections of the coating act independently as a function of position. Thus, a selectable range of incident beam angle could be analyzed.

Figure 19A:
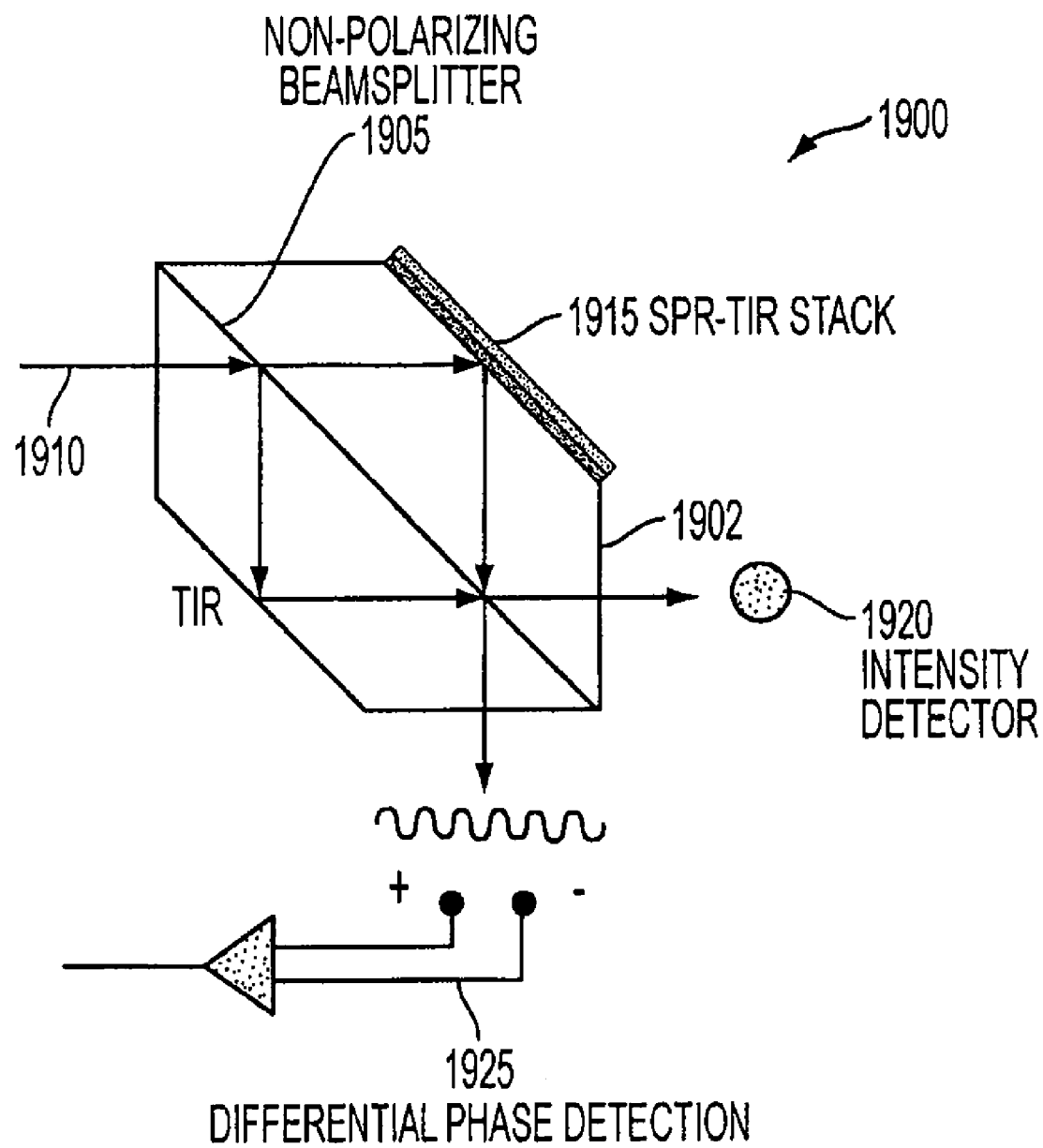

FIG. 19A schematically illustrates an interferometric embodiment of a first sensor 1900 comprising a non-polarizing beam splitter 1905 which divides an incident illumination 1910 into two paths, an SPR-TIR stack 1915 on a transmissive optical element 1902 in one of the paths, a re-combining portion of the beam splitter, an intensity detector 1920, and a differential phase detection sensor 1925 according to one embodiment of the present invention. That is, a second detector may be arranged relative to the optics such as the transmissive optical element 1902 and a first detector to electronically detect a differential beam. In the first sensor 1900, e.g., a combiner may interferometrically combine the beam of light with the differential beam to enhance the relatively high angular sensitivity.

Figure 19B:
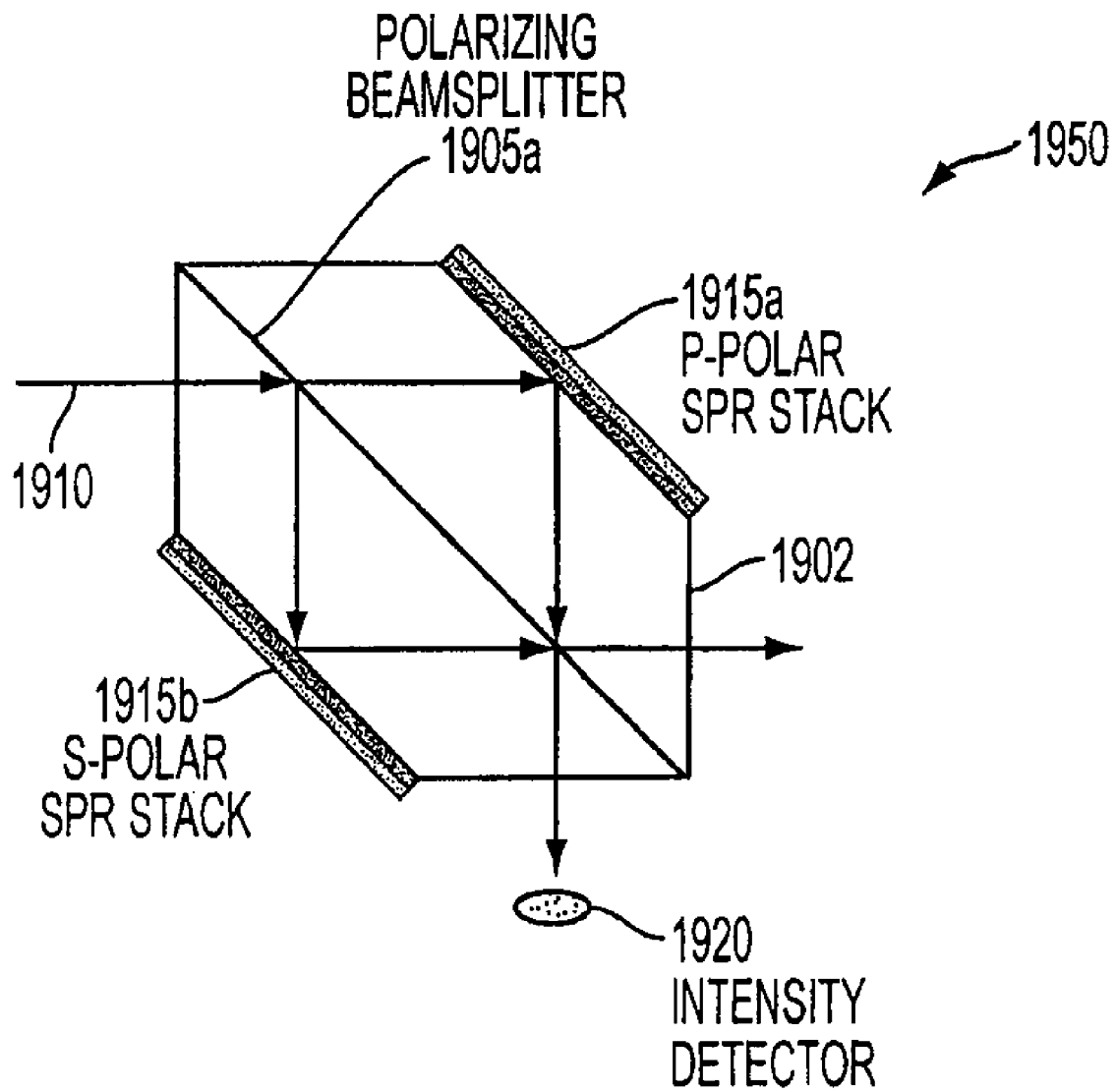

FIG. 19B schematically illustrates a polarization orientation discriminating embodiment of a second sensor 1950 comprising a polarizing beam splitter 1905*a* which divides an incident illumination 1910 into two paths, a P-polar SPR stack 1915*a* on the transmissive optical element 1902 in one of the paths, a S-polar SPR stack 1915*b* in other one of the paths, a re-combining portion of the beam splitter, and the intensity detector 1920 according to one embodiment of the present invention. In this way, the second sensor 1950 provides a pair of coating stacks on the transmissive optical element 1902 to separate S and P polarizations of illumination from the incident optical beam 1910. The second sensor 1950 forms separate S and P polarizations in phase with one another for allowing concurrent detection of S and P polarizations at the same nominal incidence angle. In one embodiment, cascaded coatings of a bi-layer stack may be configured to separate S and P polarizations of the incident illumination 1910 from the optical beam 15. The separate S and P polarizations may be obtained in phase with one another, allowing concurrent detection of S and P polarizations at the same nominal incidence angle.

Figure 20:
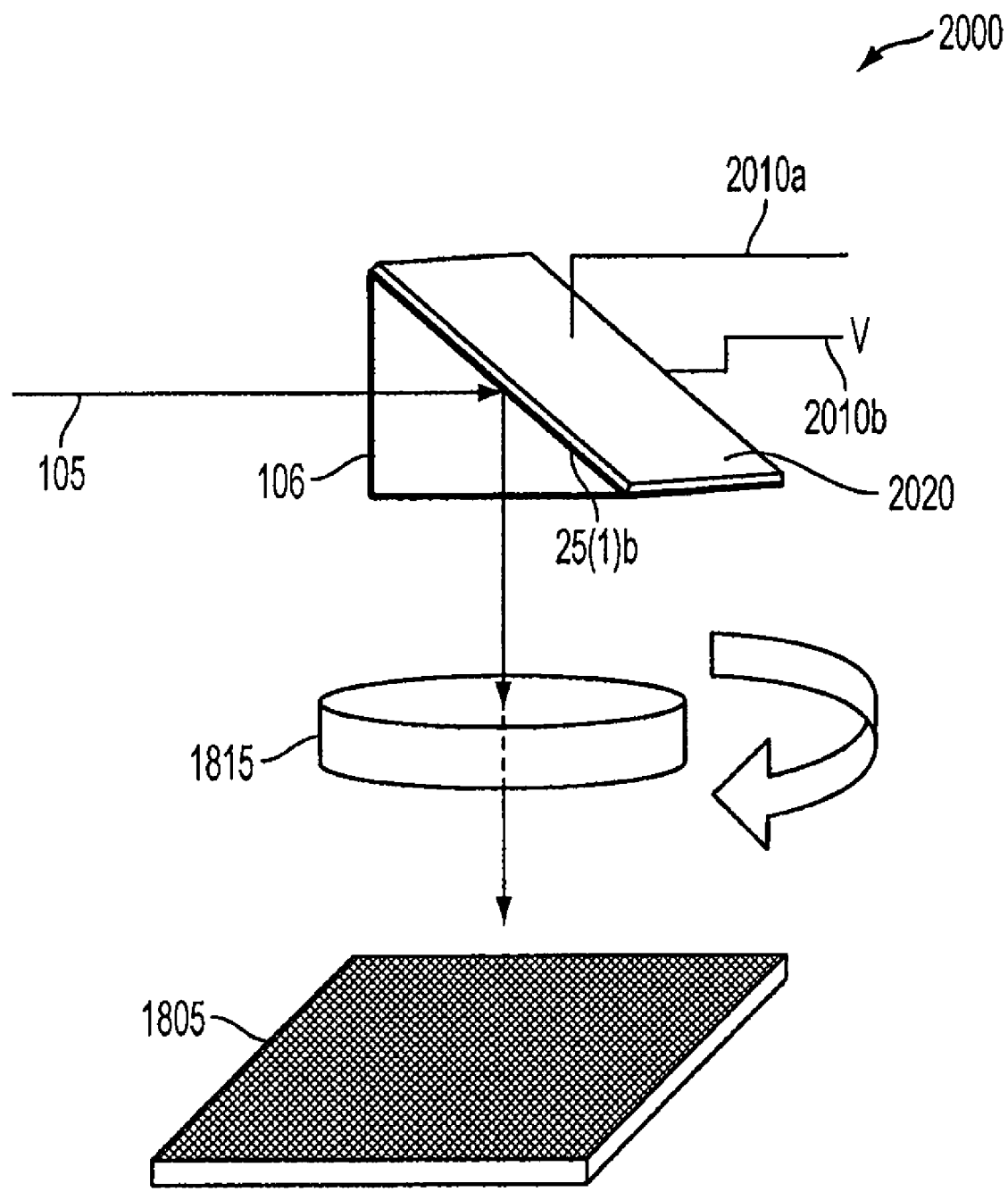

FIG. 20 schematically illustrates an electro-optically addressable embodiment of a SPR sensor 2000 according to one embodiment of the present invention. The SPR sensor 2000 comprises an electro-optically addressable element 2020 including an electro-optic surface plasmon resonance (SPR) stack 25(1)*b*. The electro-optic SPR stack 25(1)*b* may comprise at least one of a patterned electro-optic coating for providing a dielectric layer or a segmented and addressable spatially electro-optic coating.

The SPR sensor 2000 further comprises the electronic optical detector 102 which includes the photodiode array 1805, thus detecting various spatially-distributed sensor responses across a prism surface 2020 of a prism 10*b* in response to an electronic input of a voltage V at terminals 2110*a* and 2010*b* according to one embodiment of the present invention. This embodiment includes a rotatable polarizer such as the optical polarizing element 1815 between a SPR assembly and the electronic optical detector 102.

Figure 21:
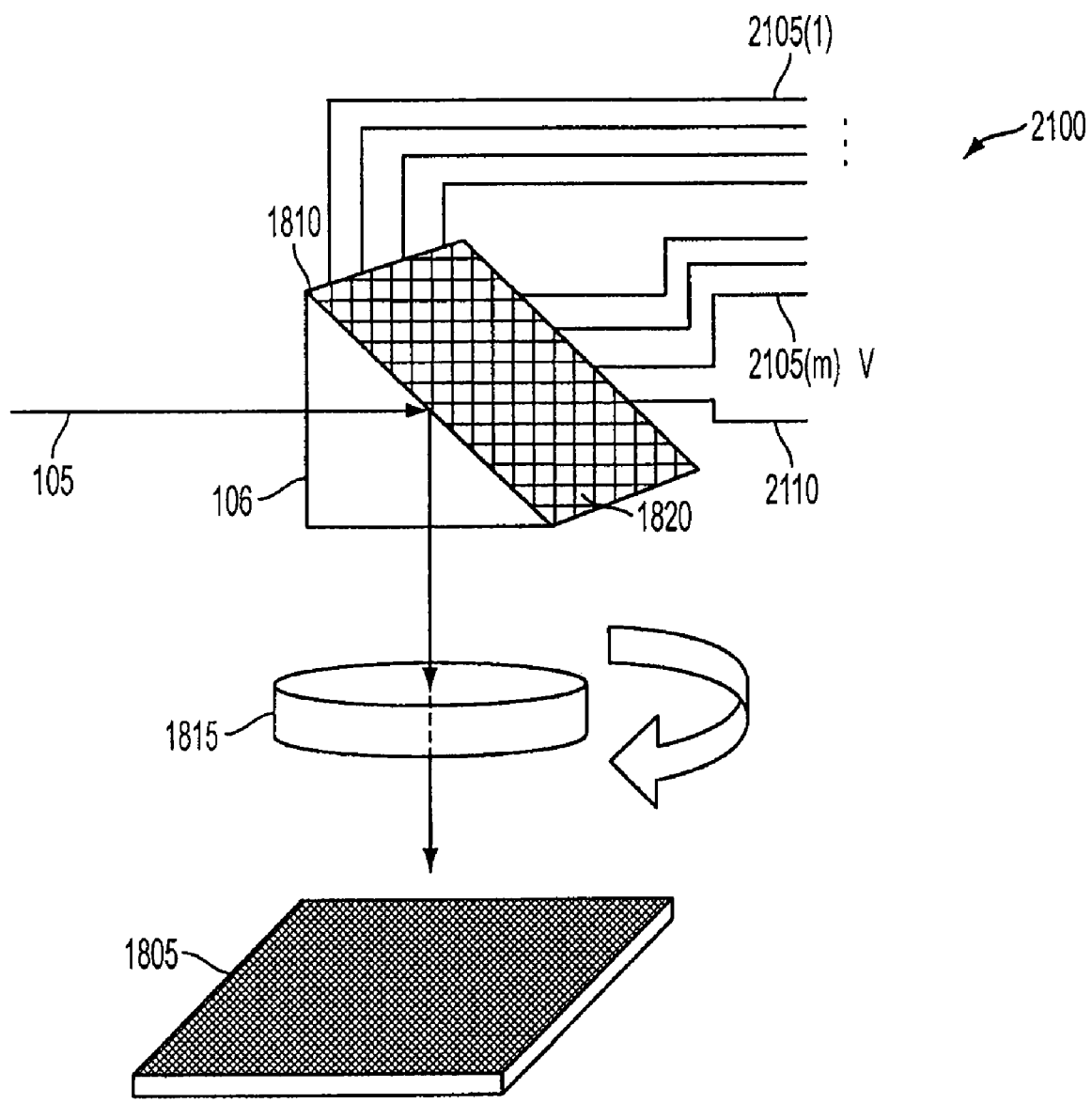

FIG. 21 schematically illustrates a segmented electro-optically addressable SPR sensor 2100 according to one embodiment of the present invention. Prism surface 1810 has a spatial-distributed SPR stack surface pattern. Different subsections of a patterned area 1820 may be formed with unique functionality. The SPR sensor 2100 further comprises the electronic optical detector 102 which includes the photodiode array 1805, thus detecting various spatially-distributed sensor responses across the prism surface 1810 of a prism 10b in response to an electronic input of a voltage V at terminals 2105(1-m) and 2110 according to one embodiment of the present invention.

Figure 22:
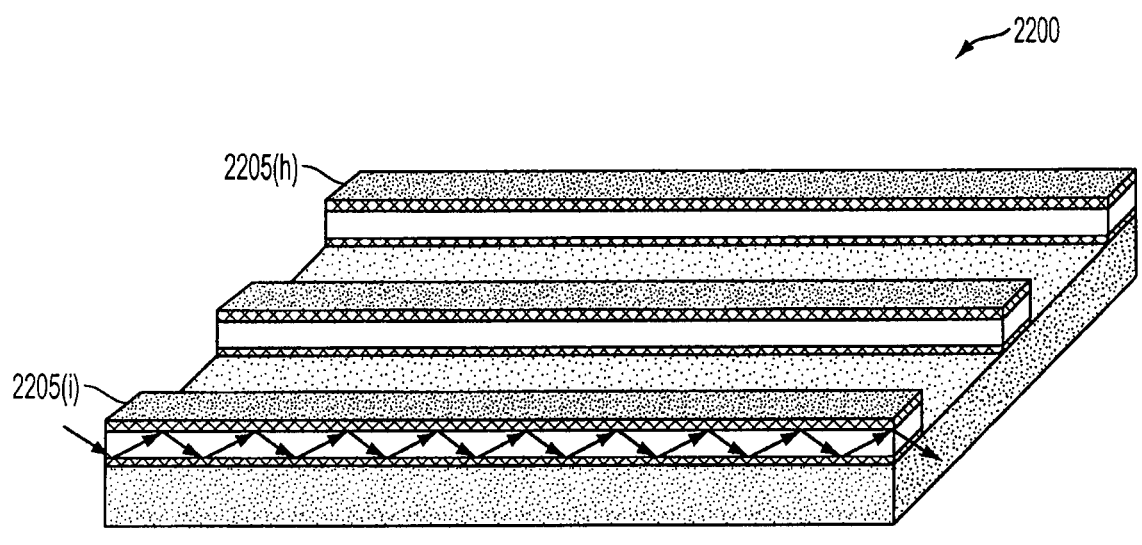

FIG. 22 schematically illustrates a slab waveguide 2200 based SPR sensor according to one embodiment of the present invention. The slab waveguide 2200 can accommodate a series of channels 2205(1-n) each of which acts as an SPR sensor.

Figure 23:
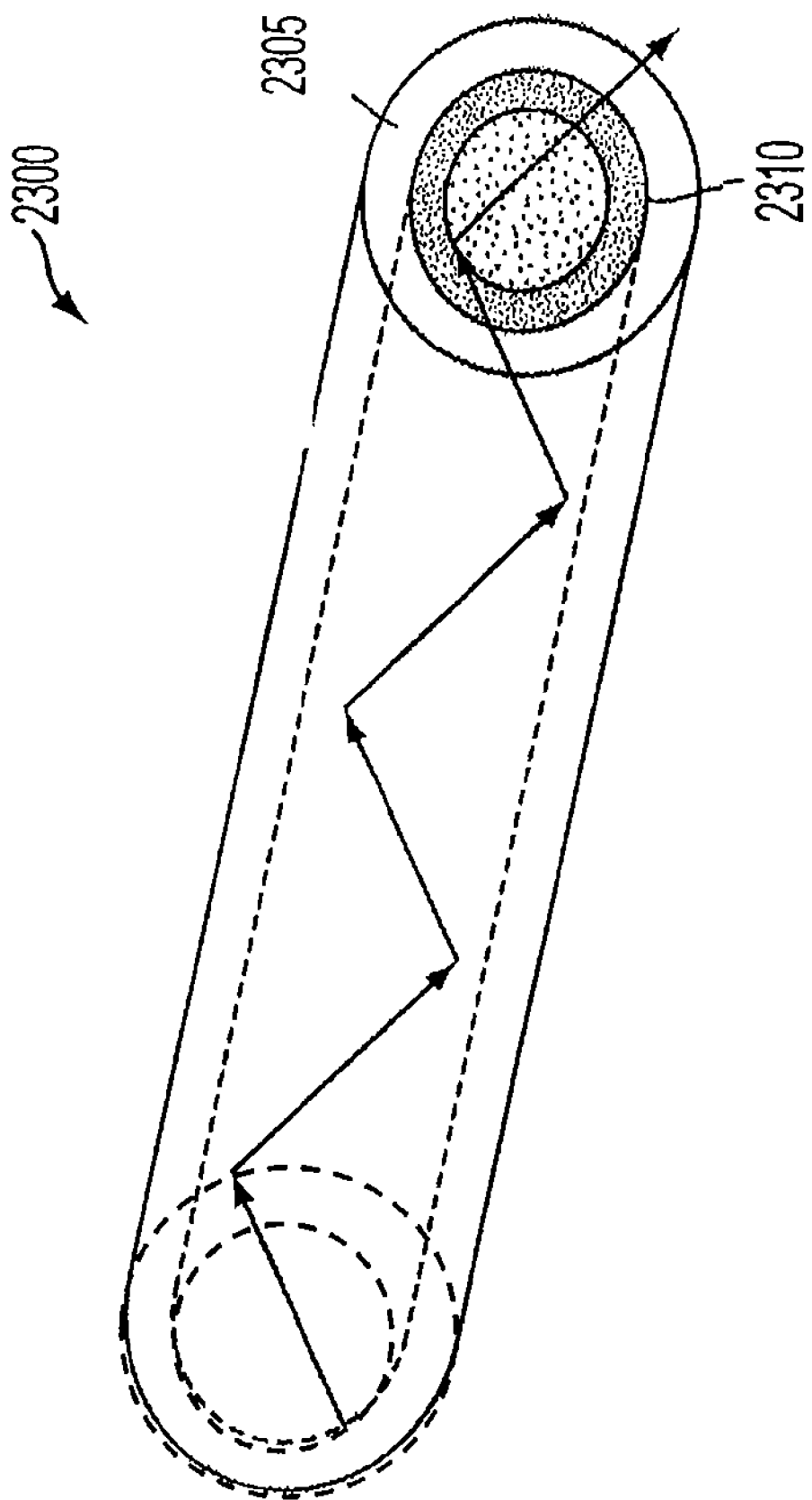

FIG. 23 schematically illustrates a cylindrically-shaped sensing element 2300 for a cylindrically-shaped SPR sensor according to one embodiment of the present invention. The cylindrically-shaped sensing element 2300 may include at least one of an optical pipe, optical fiber or optical waveguide formed using an optical fiber manufacturing process. The cylindrically-shaped SPR sensor ideally functions in the same fashion as rectangular-shaped sensors. TIR at the cylindrical SPR interface channels the illumination through a fiber or lightpipe 2305 via multiple cascaded bounces to its exit face 2310.

According one embodiment of the present invention, any one of the above described sensors such as the sensor 100a may be disposed in an Optical Maskless illuminator to obtain a direct measure of the at least one of a beam pointing and/or a beam position of the beam of light. As illustrated above, the sensor 100a may comprise a film stack such as the SPR stack 25(1)a that provides a desired surface plasmon resonance (SPR) based on at least one of a film material or a thickness of the film stack. The film material may include at least a glass-thin metal-dielectric material stack or the thickness of the film stack may be such that the film stack becomes relatively sensitive to an incident beam angle and polarization. The film stack may provide a polarization phase transition as a function of an incident angle of the beam of light. The film stack that provides a desired surface plasmon resonance (SPR) with the optics such as the optical prism 10a may be configured to provide total internal reflection (TIR) form at least one of a band-pass monitor or a band-limiting monitor.

According one embodiment of the present invention, a method of optically monitoring a beam of light in a lithographic imaging system may be provided. The method may comprise configuring an optics to provide total internal reflection (TIR) that enables a relatively high angular sensitivity for measuring a variation in at least one of a beam pointing or a beam position of the beam of light. The method may further comprise electronically detecting the variation in the beam of light. Configuring an optics to provide total internal reflection (TIR) may further comprise optically coating the optics such as the optical prism 10a to enable a rapid transmission cut-off as a function of an incident angle of the beam of light.

By optically coating the optics such as the optical prism 10a, a band-pass monitor may be formed using the optics having the optical coating that increases a given angular sensitivity based on total internal reflection (TIR). A differential beam may be electronically detected and interferometrically combined with the beam of light to enhance the relatively high angular sensitivity. A film stack such as the SPR stack 25(1)a may be provided to enable a desired surface plasmon resonance (SPR) based on at least one of a film material or a thickness of the film stack.

Figure 24:
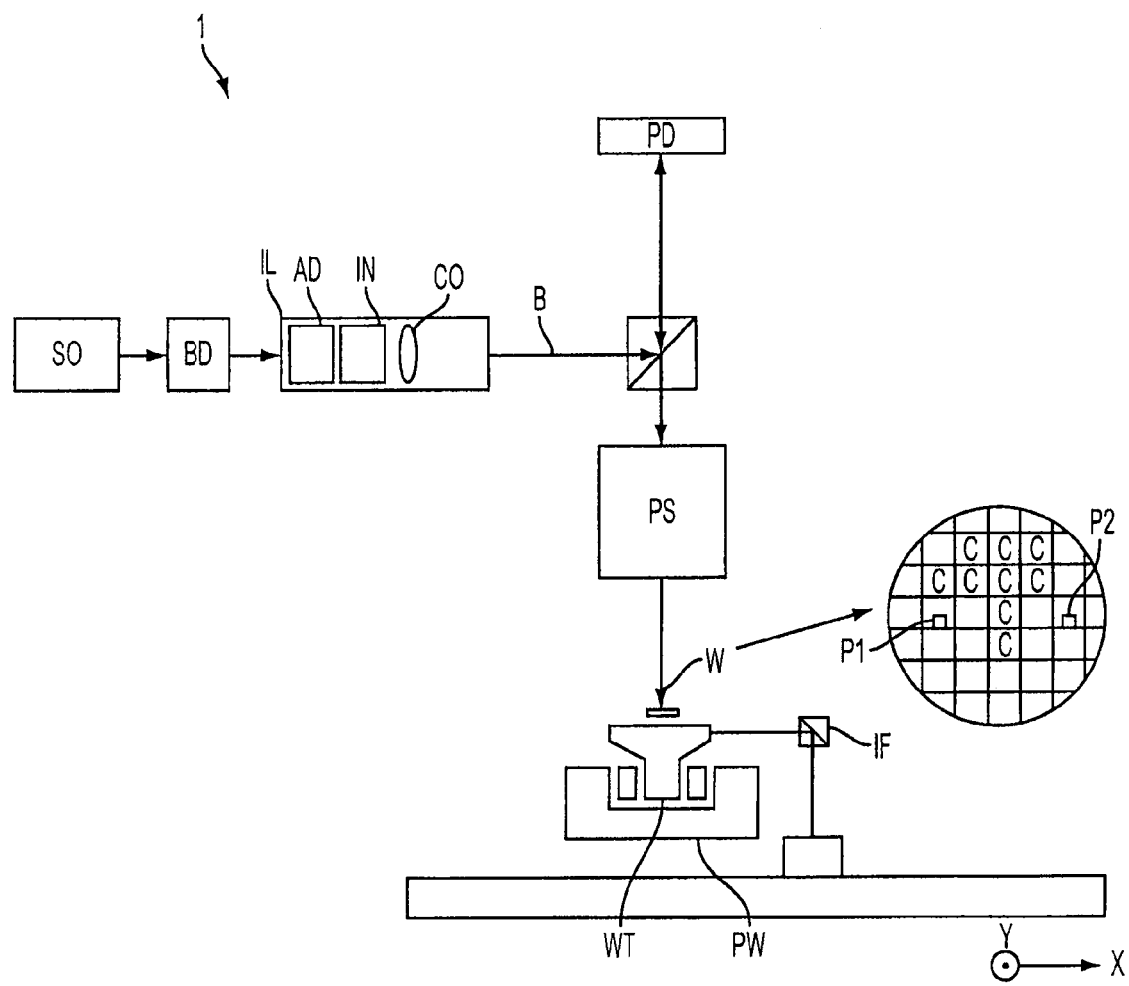

FIG. 24 schematically depicts the lithographic apparatus of one embodiment of the invention. The apparatus comprises an illumination system IL, a patterning device PD, a substrate table WT, and a projection system PS. The illumination system (illuminator) IL is configured to condition a radiation beam B (e.g., UV radiation). In an example, an optic described herein, such as and not limited to the prism 10(2), can measure a characteristic of the beam B.

The patterning device PD (e.g., a reticle or mask or an array of individually controllable elements) modulates the beam. In general, the position of the array of individually controllable elements will be fixed relative to the projection system PS. However, it can instead be connected to a positioner configured to accurately position the array of individually controllable elements in accordance with certain parameters.

The substrate table WT is constructed to support a substrate (e.g., a resist-coated substrate) W and connected to a positioner PW configured to accurately position the substrate in accordance with certain parameters.

The projection system (e.g., a refractive projection lens system) PS is configured to project the beam of radiation modulated by the array of individually controllable elements onto a target portion C (e.g., comprising one or more dies) of the substrate W.

The illumination system can include various types of optical components, such as refractive, reflective, magnetic, electromagnetic, electrostatic or other types of optical components, or any combination thereof, for directing, shaping, or controlling radiation.

The term "patterning device" or "contrast device" used herein should be broadly interpreted as referring to any device that can be used to modulate the cross-section of a radiation beam, such as to create a pattern in a target portion of the substrate. The devices can be either static patterning devices (e.g., masks or reticles) or dynamic (e.g., arrays of programmable elements) patterning devices. For brevity, most of the description will be in terms of a dynamic patterning device, however it is to be appreciated that a static pattern device can also be used without departing from the scope of the present invention.

It should be noted that the pattern imparted to the radiation beam can not exactly correspond to the desired pattern in the target portion of the substrate, for example if the pattern includes phase-shifting features or so called assist features. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Generally, the pattern created on the target portion of the substrate will correspond to a particular functional layer in a device being created in the target portion, such as an integrated circuit or a flat panel display (e.g., a color filter layer in a flat panel display or a thin film transistor layer in a flat panel display). Examples of such patterning devices include, e.g., reticles, programmable mirror arrays, laser diode arrays, light emitting diode arrays, grating light valves, and LCD arrays.

Patterning devices whose pattern is programmable with the aid of electronic means (e.g., a computer), such as patterning devices comprising a plurality of programmable elements (e.g., all the devices mentioned in the previous sentence except for the reticle), are collectively referred to herein as "contrast devices." In one example, the patterning device comprises at least 10 programmable elements, e.g., at least 100, at least 1000, at least 10000, at least 100000, at least 1000000, or at least 10000000 programmable elements.

A programmable mirror array can comprise a matrix-addressable surface having a viscoelastic control layer and a reflective surface. The basic principle behind such an apparatus is that, e.g., addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (micro-electro-mechanical system devices) can also be used in a corresponding manner. In one example, a diffractive optical MEMS device is comprised of a plurality of reflective ribbons that can be deformed relative to one another to form a grating that reflects incident light as diffracted light.

A further alternative example of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors reflect an incoming radiation beam in a different direction to unaddressed mirrors; in this manner, the reflected beam can be patterned according to the addressing pattern of the matrix-addressable mirrors. The required matrix addressing can be performed using suitable electronic means.

Another example PD is a programmable LCD array.

The lithographic apparatus can comprise one or more contrast devices. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements, and/or a common projection system (or part of the projection system).

In an example, such as the embodiment depicted in FIG. 24, the substrate W has a substantially circular shape, optionally with a notch and/or a flattened edge along part of its perimeter. In an example, the substrate has a polygonal shape, e.g., a rectangular shape. In example where the substrate has a substantially circular shape include examples where the substrate has a diameter of at least 25 mm. In an embodiment, the substrate has a diameter of at most 500 mm.

In example where the substrate has a substantially circular shape include examples where the substrate has a diameter of at least 25 mm, for instance at least 50 mm, at least 75 mm, at least 100 mm, at least 125 mm, at least 150 mm, at least 175 mm, at least 200 mm, at least 250 mm, or at least 300 mm. In an embodiment, the substrate has a diameter of at most 500 mm, at most 400 mm, at most 350 mm, at most 300 mm, at most 250 mm, at most 200 mm, at most 150 mm, at most 100 mm, or at most 75 mm. In one example, at least one side of the substrate has a length of at most 1000 cm.

In examples where the substrate is polygonal, e.g., rectangular, include examples where at least one side, e.g., at least 2 sides or at least 3 sides, of the substrate has a length of at least 5 cm, e.g., at least 25 cm, at least 50 cm, at least 100 cm, at least 150 cm, at least 200 cm, or at least 250 cm.

In examples where the substrate is polygonal, e.g., rectangular, include examples where at least one side, e.g., at least 2 sides or at least 3 sides, of the substrate has a length of at least 5 cm. In one example, at least one side of the substrate has a length of at most 1000 cm.

In one example, at least one side of the substrate has a length of at most 1000 cm, e.g., at most 750 cm, at most 500 cm, at most 350 cm, at most 250 cm, at most 150 cm, or at most 75 cm.

In one example, the substrate W is a wafer, for instance a semiconductor wafer. In one example, the wafer material is selected from the group consisting of Si, SiGe, SiGeC, SiC, Ge, GaAs, InP, and InAs. In one example, the wafer is a III/V compound semiconductor wafer. In one example, the wafer is a silicon wafer. In an embodiment, the substrate is a ceramic substrate. In one example, the substrate is a glass substrate. In one example, the substrate is a plastic substrate. In one example, the substrate is transparent (for the naked human eye). In one example, the substrate is colored. In one example, the substrate is absent a color.

The thickness of the substrate can vary and, to an extent, can depend, e.g., on the substrate material and/or the substrate dimensions. In one example, the thickness is at least 50 μm, e.g., at least 100 μm, at least 200 μm, at least 300 μm, at least 400 μm, at least 500 μm, or at least 600 μm. In one example, the thickness of the substrate is at most 5000 μm, e.g., at most 3500 μm, at most 2500 μm, at most 1750 μm, at most 1250 μm, at most 1000 μm, at most 800 μm, at most 600 μm, at most 500 μm, at most 400 μm, or at most 300 μm.

The substrate referred to herein can be processed, before or after exposure, in for example a track (a tool that typically applies a layer of resist to a substrate and develops the exposed resist), a metrology tool, and/or an inspection tool. In one example, a resist layer is provided on the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein can be considered as synonymous with the more general term "projection system."

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements such as a micro lens array (known as an MLA) or a Fresnel lens array, e.g., to form the secondary sources and to image spots onto the substrate.

In one example, the array of focusing elements (e.g., MLA) comprises at least 10 focus elements, e.g., at least 100 focus elements, at least 1000 focus elements, at least 10000 focus elements, at least 100000 focus elements, or at least 1000000 focus elements. In one example, the number of individually controllable elements in the patterning device is equal to or greater than the number of focusing elements in the array of focusing elements. In one example, one or more (e.g., 1000 or more, the majority, or about each) of the focusing elements in the array of focusing elements can be optically associated with one or more of the individually controllable elements in the array of individually controllable elements, e.g., with 2 or more of the individually controllable elements in the array of individually controllable elements, such as 3 or more, 5 or more, 10 or more, 20 or more, 25 or more, 35 or more, or 50 or more. In one example, the MLA is movable (e.g., with the use of actuators) at least in the direction to and away from the substrate, e.g., with the use of one or more actuators. Being able to move the MLA to and away from the substrate allows, e.g., for focus adjustment without having to move the substrate.

Figure 25:
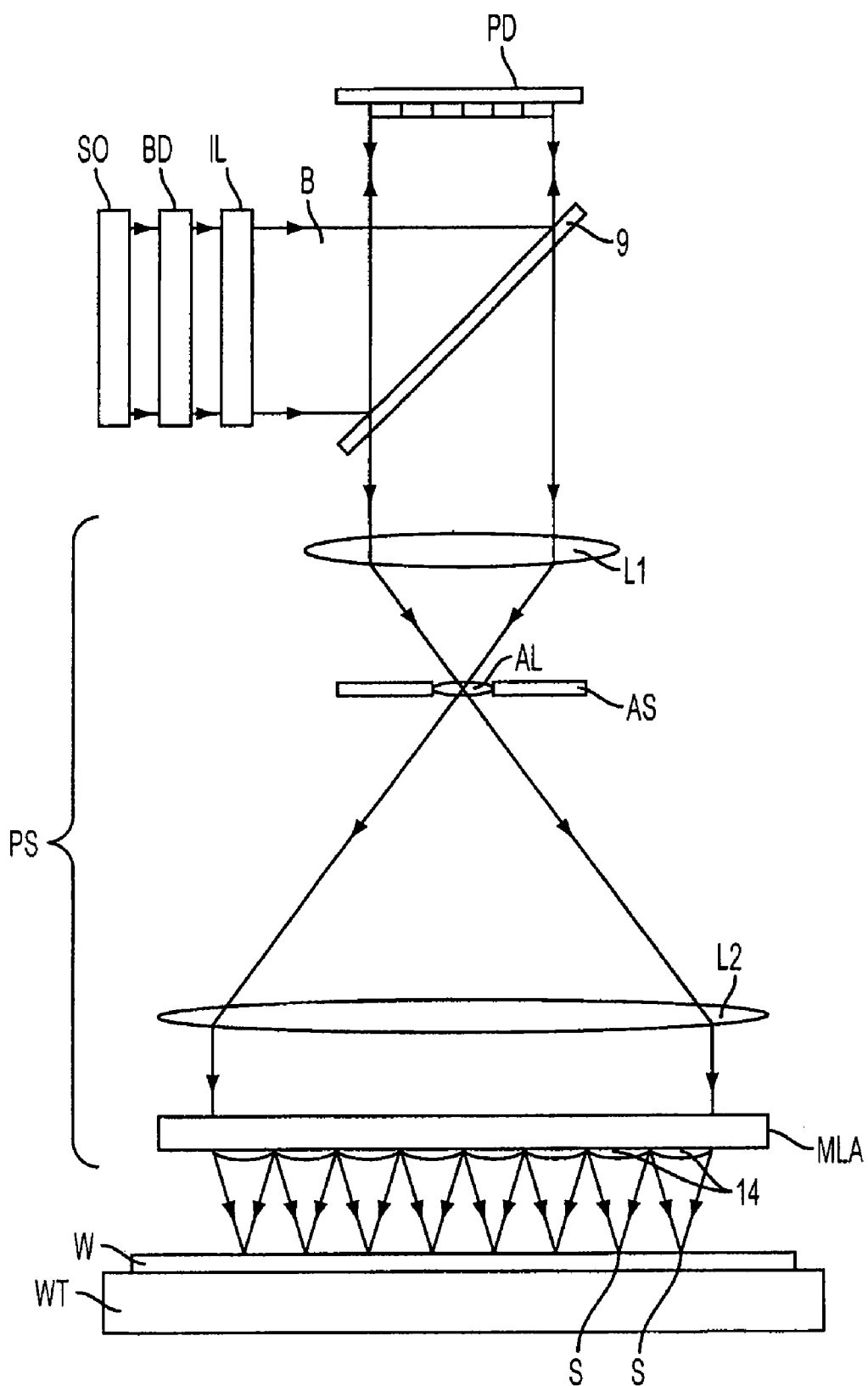

As herein depicted in FIGS. 24 and 25, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (dual stage) or more substrate tables. In such "multiple stage" machines, the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring again to FIG. 24, the illuminator IL receives a radiation beam from a radiation source SO. In one example, the radiation source provides radiation having a wavelength of at least 5 nm, e.g., at least 100 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used. The source and the lithographic apparatus can be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source can be an integral part of the lithographic apparatus, for example when the source is a mercury lamp. The source SO and the illuminator IL, together with the beam delivery system BD if required, can be referred to as a radiation system.

The illuminator IL, can comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL can comprise various other components, such as an integrator IN and a condenser CO. The illuminator can be used to condition the radiation beam to have a desired uniformity and intensity distribution in its cross-section. The illuminator IL, or an additional component associated with it, can also be arranged to divide the radiation beam into a plurality of sub-beams that can, for example, each be associated with one or a plurality of the individually controllable elements of the array of individually controllable elements. A two-dimensional diffraction grating can, for example, be used to divide the radiation beam into sub-beams. In the present description, the terms "beam of radiation" and "radiation beam" encompass, but are not limited to, the situation in which the beam is comprised of a plurality of such sub-beams of radiation.

The radiation beam B is incident on the patterning device PD (e.g., an array of individually controllable elements) and is modulated by the patterning device. Having been reflected by the patterning device PD, the radiation beam B passes through the projection system PS, which focuses the beam onto a target portion C of the substrate W. With the aid of the positioner PW and position sensor IF2 (e.g., an interferometric device, linear encoder, capacitive sensor, or the like), the substrate table WT can be moved accurately, e.g., so as to position different target portions C in the path of the radiation beam B. Where used, the positioning means for the array of individually controllable elements can be used to correct accurately the position of the patterning device PD with respect to the path of the beam B, e.g., during a scan.

In one example, movement of the substrate table WT is realized with the aid of a long-stroke module (coarse positioning) and a short-stroke module (fine positioning), which are not explicitly depicted in FIG. 24. In one example, the apparatus is absent at least a short stroke module for moving substrate table WT. A similar system can also be used to position the array of individually controllable elements. It will be appreciated that the beam B can alternatively/additionally be moveable, while the object table and/or the array of individually controllable elements can have a fixed position to provide the required relative movement. Such an arrangement can assist in limiting the size of the apparatus. As a further alternative, which can, e.g., be applicable in the manufacture of flat panel displays, the position of the substrate table WT and the projection system PS can be fixed and the substrate W can be arranged to be moved relative to the substrate table WT. For example, the substrate table WT can be provided with a system for scanning the substrate W across it at a substantially constant velocity.

As shown in FIG. 24, the beam of radiation B can be directed to the patterning device PD by means of a beam splitter BS configured such that the radiation is initially reflected by the beam splitter and directed to the patterning device PD. It should be realized that the beam of radiation B can also be directed at the patterning device without the use of a beam splitter. In one example, the beam of radiation is directed at the patterning device at an angle between 0 and 90°, e.g., between 5 and 85°, between 15 and 75°, between 25 and 65°, or between 35 and 55° (the embodiment shown in FIG. 24 is at a 90° angle). The patterning device PD modulates the beam of radiation B and reflects it back to the beam splitter BS which transmits the modulated beam to the projection system PS. It will be appreciated, however, that alternative arrangements can be used to direct the beam of radiation B to the patterning device PD and subsequently to the projection system PS. In particular, an arrangement such as is shown in FIG. 24 cannot be required if a transmissive patterning device is used.

The depicted apparatus can be used in several modes:

1. In step mode, the array of individually controllable elements and the substrate are kept essentially stationary, while an entire pattern imparted to the radiation beam is projected onto a target portion C at one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the array of individually controllable elements and the substrate are scanned synchronously while a pattern imparted to the radiation beam is projected onto a target portion C (i.e., a single dynamic exposure). The velocity and direction of the substrate relative to the array of individually controllable elements can be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In pulse mode, the array of individually controllable elements is kept essentially stationary and the entire pattern is projected onto a target portion C of the substrate W using a pulsed radiation source. The substrate table WT is moved with an essentially constant speed such that the beam B is caused to scan a line across the substrate W. The pattern on the array of individually controllable elements is updated as required between pulses of the radiation system and the pulses are timed such that successive target portions C are exposed at the required locations on the substrate W. Consequently, the beam B can scan across the substrate W to expose the complete pattern for a strip of the substrate. The process is repeated until the complete substrate W has been exposed line by line.

4. In continuous scan mode, essentially the same as pulse mode except that the substrate W is scanned relative to the modulated beam of radiation B at a substantially constant speed and the pattern on the array of individually controllable elements is updated as the beam B scans across the substrate W and exposes it. A substantially constant radiation source or a pulsed radiation source, synchronized to the updating of the pattern on the array of individually controllable elements, can be used.

5. In pixel grid imaging mode, which can be performed using the lithographic apparatus of FIG. 25, the pattern formed on substrate W is realized by subsequent exposure of spots formed by a spot generator that are directed onto patterning device PD. The exposed spots have substantially the same shape. On substrate W the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

In lithography, a pattern is exposed on a layer of resist on the substrate. The resist is then developed. Subsequently, additional processing steps are performed on the substrate. The effect of these subsequent processing steps on each portion of the substrate depends on the exposure of the resist. In particular, the processes are tuned such that portions of the substrate that receive a radiation dose above a given dose threshold respond differently to portions of the substrate that receive a radiation dose below the dose threshold. For example, in an etching process, areas of the substrate that receive a radiation dose above the threshold are protected from etching by a layer of developed resist. However, in the post-exposure development, the portions of the resist that receive a radiation dose below the threshold are removed and therefore those areas are not protected from etching. Accordingly, a desired pattern can be etched. In particular, the individually controllable elements in the patterning device are set such that the radiation that is transmitted to an area on the substrate within a pattern feature is at a sufficiently high intensity that the area receives a dose of radiation above the dose threshold during the exposure. The remaining areas on the substrate receive a radiation dose below the dose threshold by setting the corresponding individually controllable elements to provide a zero or significantly lower radiation intensity.

In practice, the radiation dose at the edges of a pattern feature does not abruptly change from a given maximum dose to zero dose even if the individually controllable elements are set to provide the maximum radiation intensity on one side of the feature boundary and the minimum radiation intensity on the other side. Instead, due to diffractive effects, the level of the radiation dose drops off across a transition zone. The position of the boundary of the pattern feature ultimately formed by the developed resist is determined by the position at which the received dose drops below the radiation dose threshold. The profile of the drop-off of radiation dose across the transition zone, and hence the precise position of the pattern feature boundary, can be controlled more precisely by setting the individually controllable elements that provide radiation to points on the substrate that are on or near the pattern feature boundary. These can be not only to maximum or minimum intensity levels, but also to intensity levels between the maximum and minimum intensity levels. This is commonly referred to as "grayscaling."

Grayscaling provides greater control of the position of the pattern feature boundaries than is possible in a lithography system in which the radiation intensity provided to the substrate by a given individually controllable element can only be set to two values (namely just a maximum value and a minimum value). In an embodiment, at least three different radiation intensity values can be projected onto the substrate, e.g., at least 4 radiation intensity values, at least 8 radiation intensity values, at least 16 radiation intensity values, at least 32 radiation intensity values, at least 64 radiation intensity values, at least 128 radiation intensity values, or at least 256 radiation intensity values.

It should be appreciated that grayscaling can be used for additional or alternative purposes to that described above. For example, the processing of the substrate after the exposure can be tuned, such that there are more than two potential responses of regions of the substrate, dependent on received radiation dose level. For example, a portion of the substrate receiving a radiation dose below a first threshold responds in a first manner; a portion of the substrate receiving a radiation dose above the first threshold but below a second threshold responds in a second manner; and a portion of the substrate receiving a radiation dose above the second threshold responds in a third manner. Accordingly, grayscaling can be used to provide a radiation dose profile across the substrate having more than two desired dose levels. In an embodiment, the radiation dose profile has at least 2 desired dose levels, e.g., at least 3 desired radiation dose levels, at least 4 desired radiation dose levels, at least 6 desired radiation dose levels or at least 8 desired radiation dose levels.

It should further be appreciated that the radiation dose profile can be controlled by methods other than by merely controlling the intensity of the radiation received at each point on the substrate, as described above. For example, the radiation dose received by each point on the substrate can alternatively or additionally be controlled by controlling the duration of the exposure of the point. As a further example, each point on the substrate can potentially receive radiation in a plurality of successive exposures. The radiation dose received by each point can, therefore, be alternatively or additionally controlled by exposing the point using a selected subset of the plurality of successive exposures.

In order to form the required pattern on the substrate, it is necessary to set each of the individually controllable elements in the patterning device to the requisite state at each stage during the exposure process. Therefore, control signals, representing the requisite states, must be transmitted to each of the individually controllable elements. In one example, the lithographic apparatus includes a controller that generates the control signals. The pattern to be formed on the substrate can be provided to the lithographic apparatus in a vector-defined format, such as GDSII. In order to convert the design information into the control signals for each individually controllable element, the controller includes one or more data manipulation devices, each configured to perform a processing step on a data stream that represents the pattern. The data manipulation devices can collectively be referred to as the "datapath."

The data manipulation devices of the datapath can be configured to perform one or more of the following functions: converting vector-based design information into bitmap pattern data; converting bitmap pattern data into a required radiation dose map (namely a required radiation dose profile across the substrate); converting a required radiation dose map into required radiation intensity values for each individually controllable element; and converting the required radiation intensity values for each individually controllable element into corresponding control signals.

FIG. 25 depicts an arrangement of the OML apparatus according to the present invention. Components corresponding to those shown in FIG. 24 are depicted with the same reference numerals. Also, the above descriptions of the various embodiments, e.g., the various configurations of the substrate, the contrast device, the MLA, the beam of radiation, etc., remain applicable.

FIG. 25 depicts an arrangement of a lithographic apparatus, according to one embodiment of the present invention. This embodiment can be used, e.g., in the manufacture of flat panel displays. Components corresponding to those shown in FIG. 24 are depicted with the same reference numerals. Also, the above descriptions of the various embodiments, e.g., the various configurations of the substrate, the contrast device, the MLA, the beam of radiation, etc., remain applicable.

As shown in FIG. 25, the projection system PS includes a beam expander, which comprises two lenses L1, L2. The first lens L1 is arranged to receive the modulated radiation beam B and focus it through an aperture in an aperture stop AS. A further lens AL can be located in the aperture. The radiation beam B then diverges and is focused by the second lens L2 (e.g., a field lens).

The projection system PS further comprises an array of lenses MLA arranged to receive the expanded modulated radiation B. Different portions of the modulated radiation beam B, corresponding to one or more of the individually controllable elements in the patterning device PD, pass through respective different lenses in the array of lenses MLA. Each lens focuses the respective portion of the modulated radiation beam B to a point which lies on the substrate W. In this way an array of radiation spots S is exposed onto the substrate W. It will be appreciated that, although only eight lenses of the illustrated array of lenses 14 are shown, the array of lenses can comprise many thousands of lenses (the same is true of the array of individually controllable elements used as the patterning device PD).

A pattern on a substrate W may be generated using the system of FIG. 25, according to one embodiment of the present invention by projecting an array of spots S onto the substrate W by the array of lenses MLA in the projection system PS. The substrate W is moved relative to the projection system PS in the Y direction as a series of exposures are exposed on the substrate W. The open circles represent spot exposures SE that have previously been exposed on the substrate W. Each spot projected onto the substrate by the array of lenses within the projection system PS exposes a row R of spot exposures on the substrate W. The complete pattern for the substrate is generated by the sum of all the rows R of spot exposures SE exposed by each of the spots S. Such an arrangement is commonly referred to as "pixel grid imaging," discussed above.

For example, the array of radiation spots S may be arranged at an angle θ relative to the substrate W (the edges of the substrate lie parallel to the X and Y directions). This is done so that when the substrate is moved in the scanning direction (the Y-direction), each radiation spot will pass over a different area of the substrate, thereby allowing the entire substrate to be covered by the array of radiation spots 15. In one example, the angle θ is at most 20°, 10°, e.g., at most 5°, at most 3°, at most 1°, at most 0.5°, at most 0.25°, at most 0.10°, at most 0.05°, or at most 0.01°. In one example, the angle θ is at least 0.001°.

In an OML system, such as shown in FIGS. 24-25, which are a single pulse tools, each pulse tool is ideally desired with a zero pointing and a zero positioning errors for a beam of light going into an illumination system. A typical laser beam of a single pulse itself may be off by a few millimeters (mm) or miliradians (mrad). This makes a single pulse printing difficult.

In various examples, this single beam of light can be sent directly to a patterning device PD, or can alternatively be directed to the patterning device via a beam splitter (for example as shown in FIGS. 1 and 2) or some other suitable beam transmission means.

In one example, the f-numbers of the beams are chosen to be sufficiently large that the variations in optical path length do not have an appreciable effect on the beam that is incident upon the patterning device PD (e.g., telecentricity, field curvature, etc).

The above description herein refers to light, light sources and beams of light. It will be appreciated that the light referred to is not limited to light having a visible wavelength, and can include other wavelengths including ultraviolet light or infrared light which are suitable for lithography, as discussed above.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example imprint lithography, where the context allows, and is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

Figure 26:
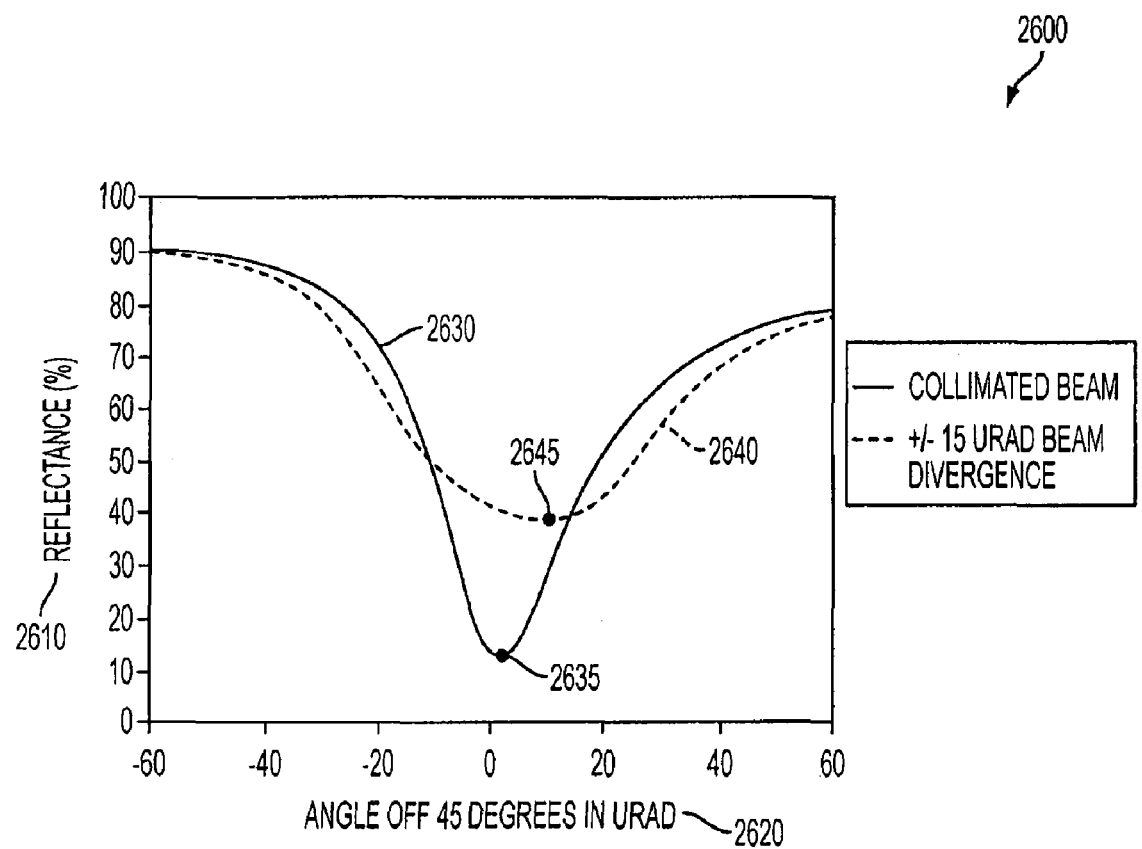
FIG. 26 is a graph of reflectance versus angle of incidence of a beam incident on an SPR film stack deposited on a surface of that optic.

FIG. 26 is a graph 2600 of reflectance 2610 from an optic having internal reflection versus angle of incidence 2620 of a beam incident on an SPR film stack deposited on a surface of that optic. Two plots are illustrated. A first plot 2630 shows the reflectance versus the angle of incidence for a reference beam having substantially no divergence, in this case a collimated beam having a wavelength of 193 nm. The first plot 2630 has a minimum reflectance 2635 when the angle of incidence induces a substantially maximum SPR. In the example of FIG. 26, the first plot 2630 from the reference beam has a minimum reflectance of 10%. The collimated beam can be used as the reference beam to establish a reference data set to which other measurements of the reflectance 2610 versus the angle of incidence 2620 are compared. The reference data set need not be determined from the collimated beam. However, use of a non-collimated beam will not account for defects in the optic, such as material defects, fabrication errors, material thickness differences, and refractive index variations. Thus, the reference data set from the collimated beam will provide the most accurate reference data set.

A second plot 2640 illustrates reflectance 2610 versus angle of incidence 2620 for a divergent beam. The divergent beam causes a minimum reflectance 2645 that is greater than that of the collimated beam, due to effects of SPR. The minimum reflectance of the divergent beam 2645 occurs at an associated angle of incidence 2620 that is different from that of the reference beam. The divergent beam's angle of divergence can be calculated from the first and second plots 2630, 2640. For example, the angle of divergence can be calculated from a difference between the angle of incidence 2620 associated with the minimum reflectance of the divergent beam 2645 and the angle of incidence 2620 associated with the minimum reflectance of the reference beam 2635.

Figure 27:
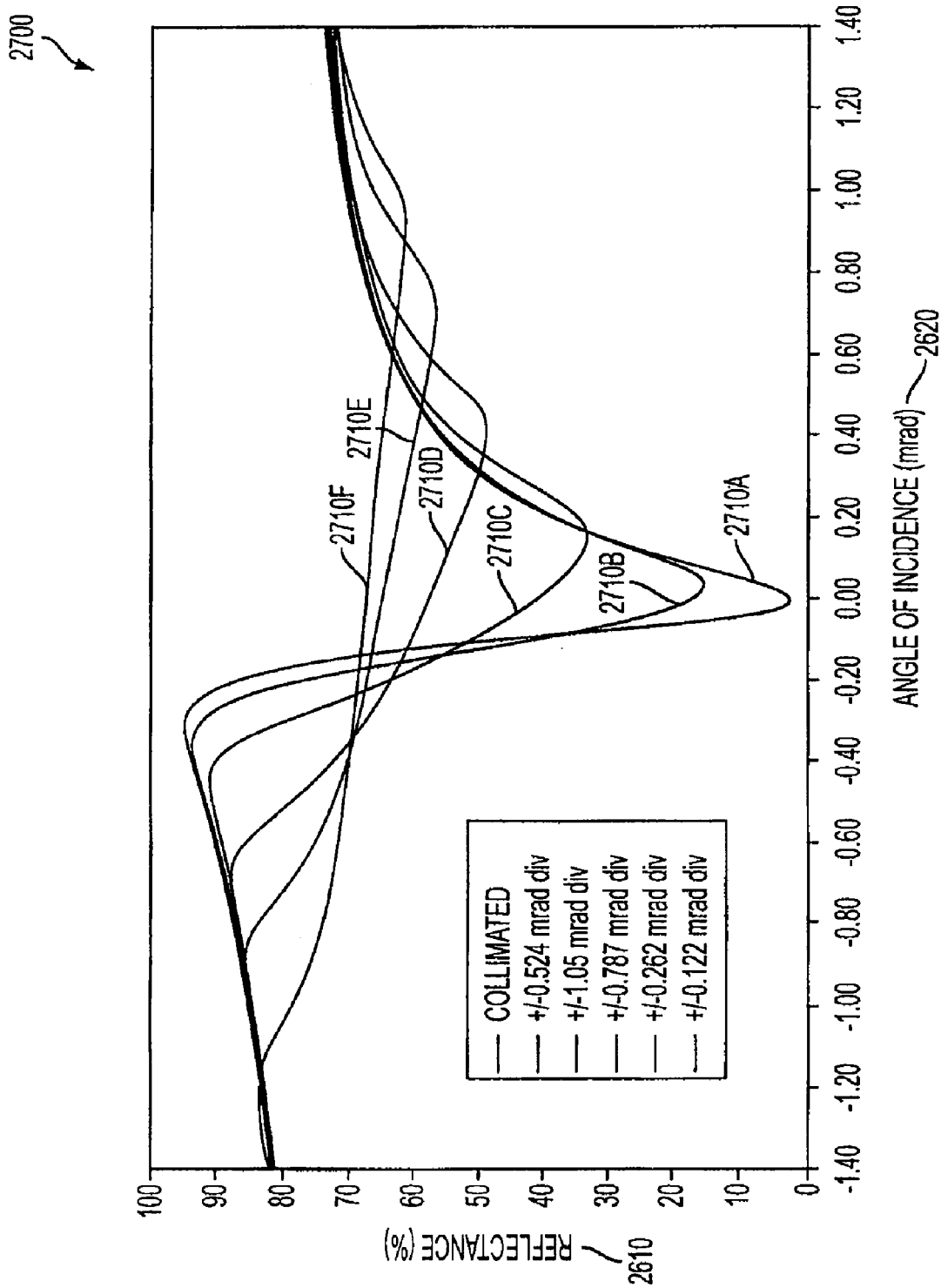
FIG. 27 is a plot of reflectance versus angle of incidence according to an embodiment of the invention.

FIG. 27 is a plot 2700 of the reflectance 2610 versus the angle of incidence 2620 according to an embodiment of the present invention. In this figure, six plots 2710A-F are shown to illustrate that a minimum reflectance increases as a divergence half angle of an incident beam also increases. Further, FIG. 27 illustrates that as the divergence half angle increases, the minimum reflectance occurs at increasing angles of incidence 2620. Each of the six plots 2710A-F has a respective minimum reflectance which forms a basis for FIG. 28.

FIG. 28 is a graph 2800 of minimum reflectance shifting 2810 as a function of changes in the divergence angle 2820 according to an embodiment of the invention. Graph 2800 illustrates six data points 2830A-F determined from FIG. 27. The six data points 2830A-F correspond to respective differences between the angles of incidence 2620 associated with the minimum reflectances of the respective divergent beams and, in this example, a collimated reference beam's angle of incidence of zero. The divergence angle 2820 is determined from the graph 2800 and the difference between the angle of incidence 2620 associated with the minimum reflectance of the divergent beam and the angle of incidence 2620 associated with the minimum reflectance of the reference beam. In this example, the data illustrated in the graph 2800 was obtained using an SPR prism having a 65 μm thick dielectric.

FIG. 29 is a plot 2900 showing further features according to an embodiment of the present invention. Two plots are illustrated. A first plot 2910 shows reflectance 2610 versus angle of incidence 2620 for a reference beam having substantially no divergence, in this case a collimated beam. A second plot 2920 illustrates reflectance 2610 versus angle of incidence 2620 for a divergent beam. As illustrated in FIG. 29, as beam divergence increases, a width of a notch shown in the plot 2900 increases. The notch is caused by a reduction in the reflectance 2610 over a range of angles of incidence 2620 resulting from SPR. Thus, the width of the notch can be calculated from a data set determined by measuring reflectance 2610 of the divergent beam over the angles of incidence 2620. A divergence angle of the divergent beam can be determined by comparing the notch width from the divergent beam to a notch width from a reference beam. The difference between the two notch widths correlates to the divergence angle of the divergent beam.

FIG. 29 also illustrates that as the divergence angle increases, a depth (D)-to-width (W) aspect ratio (D/W) of the notch decreases. In an example, the width (W) is determined by calculating a difference in the angle of incidence 2620 between a first angle of incidence corresponding to a minimum reflectance 2930 and a second angle of incidence corresponding to a maximum reflectance 2940. The depth (D) is determined by calculating a difference in reflectance between the maximum reflectance 2940 and the minimum reflectance 2930. A reference D/W aspect ratio is calculated from data collected by measuring reflectance 2610 versus angle of incidence 2620 of a reference beam. In this example, the reference beam is a collimated beam, thus the notation $D_{col}/W_{col}$ is used for the reference beam. A $D_{div}/W_{div}$, aspect ratio for the divergent beam is also calculated. A normalized notch aspect ratio 3010 is then determined by calculating $[(D_{div}/W_{div})/(D_{col}/W_{col})]*100$. Thus, the normalized D/W aspect ratio 3010 of the collimated beam is 100. A divergence angle 3020 of the divergent incident beam can be determined from a reduction in the normalized notch D/W aspect ratio 3010. The reduction in the normalized notch D/W aspect ratio 3010 correlates to the divergence angle 3020 of the divergent beam as illustrated in FIG. 30.

FIG. 30 is a graph 3000 of changes in the normalized notch aspect ratio 3010 in an SPR prism having a 65 urn thick dielectric as a function of the divergence angle 3020 according to an embodiment of the invention. The normalized notch D/W aspect ratio 3010 decreases as a function of divergence 3020 and can be matched to a plot of a fourth-order equation, such as: $y=7.0982x4-55.744x3+158.1x2-198.27x+100.72$. A plot of this equation 3030 is also illustrated in FIG. 30 and yields R=0.999. The divergence angle 3020 of the divergent beam is determined from the graph 3000 and the normalized notch aspect ratio 3010.

FIG. 31 is a flow chart of a method of using an apparatus for optical beam divergence measurement according to an embodiment of the invention.

In step 3105, a first plurality of reflectivities is measured for a respective first plurality of angles of incidence of a first beam of radiation on an optic having internal reflection and surface plasmon resonance to determine a first data set. The first beam of radiation can have an angle of incidence on a hypotenuse of the optic of between substantially 35 degrees and substantially 48 degrees as the first beam of radiation.

In step 3110, a second plurality of reflectivities is measured for a respective second plurality of angles of incidence of a second beam of radiation on the optic to determine a second data set. The optic can be a polarizing prism. The first beam of radiation can be used as the second beam of radiation. The first plurality of angles of incidence can be used as the second plurality of angles of incidence. In an example, the first beam of radiation is a collimated beam of radiation.

In examples, the first and second beams of radiation can have a wavelength of substantially 193 nm, substantially 436 nm, substantially 405 nm, substantially 365 nm, substantially 355 nm, substantially 248 nm, substantially 193 nm, substantially 157 nm, and substantially 126 nm. At least one of the first and second beams of radiation can be polarized.

In step 3115, the first data set is compared to the second data set to determine a divergence angle between the first and the second beams of radiation. In an example of step 3115, a first notch width is calculated from the first data set and a second notch width is calculated from the second data set. The divergence angle is calculated from a difference between the first notch width and the second notch width.

In a further example of step 3115, a first minimum reflectance having a corresponding first angle of incidence is calculated from the first data set. A second minimum reflectance having a corresponding second angle of incidence is calculated from the second data set. The divergence angle is calculated from a difference between the first angle of incidence and the second angle of incidence.

In a further example of step 3115, a first notch width-to-depth aspect ratio from the first data set and a second notch width-to-depth aspect ratio from the second data set are calculated. The divergence angle is calculated from a difference between the first notch width-to-depth aspect ratio and the second notch width-to-depth aspect ratio.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method, comprising:
    illuminating, with a radiation beam, an optic comprising an internal surface and a transmissive material configured to allow surface plasmon resonance (SPR) assisted total internal reflection (TIR) of the radiation beam,
    wherein the radiation beam reflects from the internal surface of the optic at an incident angle or a range of angles comprising a divergence angle;
    electronically measuring a percentage of radiation reflected from the optic; and
    determining at least one of the incident angle and the divergence angle of the radiation beam based on a known angular dependence of the percentage of radiation reflected from the optic.

2. The method of claim 1, wherein a portion of a surface of the optic is coated with a layer configured to increase angular sensitivity of a reflective surface of the optic relative to an interferometric alignment of the radiation beam.

3. The method of claim 2, wherein the layer comprises a plurality of coatings configured to provide the SPR and a comb of resonances having an asymmetric absorption notch.

4. The method of claim 2, wherein the layer includes a dielectric layer having a stepped wedge shape and having first and second portions with different thicknesses.

5. The method of claim 1, further comprising:
    manipulating a pupil of an optical system to change an illumination angle of the radiation beam and change a sensitivity of the electronic measurement.

6. The method of claim 1, wherein the illuminating comprises scanning the optic with the radiation beam.

7. The method of claim 1, wherein a portion of a surface of the optic is coated with a pair of coating stacks to separate S and P polarizations of the radiation beam.

8. The method of claim 1, further comprising:
    measuring a first plurality of reflectivities for a respective first plurality of angles of incidence of the radiation beam to determine a first data set;
    measuring a second plurality of reflectivities for a respective second plurality of angles of incidence of a second beam of radiation on the optic to determine a second data set; and
    comparing the first data set to the second data set to determine the divergence angle between the first and the second beams of radiation.

9. The method of claim 8, wherein the comparing includes:
    calculating a first notch width from the first data set and a second notch width from the second data set; and
    determining the divergence angle from a difference between the first notch width and the second notch width.

10. The method of claim 8, wherein the comparing includes:
    calculating, from the first data set, a first minimum reflectance having a corresponding first angle of incidence;
    calculating, from the second data set, a second minimum reflectance having a corresponding second angle of incidence; and
    calculating a difference between the first angle of incidence and the second angle of incidence to determine the divergence angle.

11. A sensor, comprising:
    an optic comprising an internal surface and a transmissive material configured to allow surface plasmon resonance (SPR) assisted total internal reflection (TIR) of an incident radiation beam, wherein the optic is configured so that the radiation beam reflects from the internal surface of the optic at an incident angle, or a range of angles comprising a divergence angle; and a detector configured to electronically measure a percentage of radiation reflected from the optic, and wherein the detector is further configured to determine at least one of the incident angle and the divergence angle of the radiation beam based on a known angular dependence of the percentage of radiation reflected from the optic.

12. The sensor of claim 11, wherein the transmissive material includes a bi-layer stack of absorbing and transmitting optical materials that enable the SPR.

13. The sensor of claim 12, wherein multiple coatings of the bi-layer stack are cascaded.

14. The sensor of claim 13, wherein the cascaded coatings of the bi-layer stack are configured to provide alternating TIR surfaces and SPR surfaces.

15. The sensor of claim 13, wherein the cascaded coatings of the bi-layer stack are configured to separate S and P polarizations of incident radiation.

16. The sensor of claim 11, wherein a portion of a surface of the optic includes a patterned bi-layer coating having coating subsections configured to reflect incident radiation independently as a function of position.

17. The sensor of claim 11, wherein a portion of a surface of the optic includes a dielectric layer coating in a shape of a stepped wedge having first and second portions with different thicknesses.

18. The sensor of claim 11, wherein the detector comprises a photodiode array configured to detect spatially-distributed radiation reflected from a surface of the optic.

19. The sensor of claim 11, wherein the optic is cylindrically-shaped.

20. A lithographic apparatus, comprising:
an illumination system configured to condition a radiation beam and comprising a sensor configured to measure an incident angle or divergence angle of the radiation beam, the sensor including:
an optic comprising an internal surface and a transmissive material configured to allow surface plasmon resonance (SPR) assisted total internal reflection (TIR) of the radiation beam,
wherein the optic is configured so that the radiation beam reflects from the internal surface of the optic at an incident angle, or a range of angles comprising, a divergence angle; and
a detector configured to electronically measure a percentage of radiation reflected from the optic, and wherein the detector is further configured to determine at least one of the incident angle and the divergence angle of the radiation beam based on a known angular dependence of the percentage of radiation reflected from the optic;
an array of individually controllable elements configured to modulate the beam of radiation; and
a projection system configured to project the modulated radiation beam onto a target portion of a photosensitive substrate.

21. The lithographic apparatus of claim 20, wherein the optic comprises a coating configured to enable transmission cut-off as a function of an incident angle of the radiation beam.

22. The lithographic apparatus of claim 20, wherein the sensor further comprises a second detector, configured to electronically detect a differential radiation beam, arranged relative to both the optic and the first detector.

23. The lithographic apparatus of claim 22, wherein the sensor further comprises a combiner configured to interferometrically combine the radiation beam with the differential radiation beam to change an angular sensitivity of the sensor.

24. The lithographic apparatus of claim 20, wherein the optic further comprises a film stack configured to provide SPR based on at least one of a film material and a thickness of the film stack.

25. The lithographic apparatus of claim 20, wherein the optic is a prism and a portion of a surface of the prism includes cascaded coatings comprising a bi-layer stack of a thin absorbing metal layer and a thicker dielectric layer configured:
as a waveguide that enables the SPR; and
to separate S and P polarizations of the incident radiation beam, in phase with one another at the same nominal incidence angle.p

* * * * *